(12) United States Patent
Nagai et al.

(10) Patent No.: US 9,567,693 B2
(45) Date of Patent: *Feb. 14, 2017

(54) METHOD FOR PRODUCING A GROUP III NITRIDE SEMICONDUCTOR SINGLE CRYSTAL AND METHOD FOR PRODUCING A GAN SUBSTRATE

(71) Applicant: TOYODA GOSEI CO., LTD., Kiyosu-shi (JP)

(72) Inventors: Seiji Nagai, Kiyosu (JP); Miki Moriyama, Kiyosu (JP); Shohei Kumegawa, Kiyosu (JP); Shiro Yamazaki, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 829 days.

This patent is subject to a terminal disclaimer.

(21) Appl. No.: 13/762,318

(22) Filed: Feb. 7, 2013

(65) Prior Publication Data

US 2013/0199438 A1 Aug. 8, 2013

(30) Foreign Application Priority Data

Feb. 8, 2012 (JP) .................. 2012-025478
Mar. 19, 2012 (JP) .................. 2012-062268
Mar. 19, 2012 (JP) .................. 2012-062530

(51) Int. Cl.
  *C30B 19/12* (2006.01)
  *C30B 19/02* (2006.01)
  (Continued)

(52) U.S. Cl.
  CPC ............. *C30B 19/12* (2013.01); *C30B 9/10* (2013.01); *C30B 19/02* (2013.01); *C30B 29/403* (2013.01)

(58) Field of Classification Search
  CPC ........ C30B 19/02; C30B 19/12; C30B 29/403; C30B 9/10
  See application file for complete search history.

(56) References Cited

U.S. PATENT DOCUMENTS 6,979,584 B2   12/2005   Koike et al.
7,176,115 B2    2/2007   Kitaoka et al.
(Continued)

FOREIGN PATENT DOCUMENTS

CN   1413357 A   4/2003
CN   1429401 A   7/2003
(Continued)

OTHER PUBLICATIONS

Chinese Office Action dated Feb. 11, 2015 with an English translation thereof.
(Continued)

*Primary Examiner* — Michael Kornakov
*Assistant Examiner* — Hua Qi
(74) *Attorney, Agent, or Firm* — McGinn IP Law Group, PLLC

(57) ABSTRACT

The present invention provides a method for producing a Group III nitride semiconductor single crystal having excellent crystallinity, and a method for producing a GaN substrate having excellent crystallinity, the method including controlling melting back. Specifically, a mask layer is formed on a GaN substrate serving as a growth substrate. Then, a plurality of trenches which penetrate the mask layer and reach the GaN substrate are formed through photolithography. The obtained seed crystal and raw materials of a single crystal are fed to a crucible and subjected to treatment under pressurized and high temperature conditions. Portions of the GaN substrate exposed to the trenches undergo melting back with a flux. Through dissolution of the GaN (Continued)

substrate, the dimensions of the trenches increase, to provide large trenches. The GaN layer is grown from the surface of the mask layer as a starting point.

13 Claims, 12 Drawing Sheets

(51) Int. Cl.
  *C30B 9/10* (2006.01)
  *C30B 29/40* (2006.01)

(56) References Cited

U.S. PATENT DOCUMENTS

| | | | |
|---|---|---|---|
| 7,560,725 | B2 | 7/2009 | Koike et al. |
| 8,928,004 | B2 | 1/2015 | Choe et al. |
| 9,117,674 | B2 | 8/2015 | Eymery et al. |
| 2002/0117104 | A1* | 8/2002 | Hata .............. B82Y 20/00 117/97 |
| 2003/0092263 | A1 | 5/2003 | Koike et al. |
| 2004/0089919 | A1 | 5/2004 | Motoki et al. |
| 2004/0147096 | A1 | 7/2004 | Kitaoka et al. |
| 2004/0183090 | A1 | 9/2004 | Kitaoka et al. |
| 2005/0059229 | A1 | 3/2005 | Minemoto et al. |
| 2005/0082564 | A1 | 4/2005 | Kitaoka |
| 2006/0027831 | A1 | 2/2006 | Kioke et al. |
| 2007/0084399 | A1 | 4/2007 | Sarayama et al. |
| 2011/0024796 | A1* | 2/2011 | Miyoshi .............. C30B 19/00 257/194 |
| 2011/0110840 | A1 | 5/2011 | Miyanaga et al. |
| 2011/0155046 | A1* | 6/2011 | Yamazaki .............. C30B 9/10 117/56 |
| 2012/0085279 | A1 | 4/2012 | Sarayama et al. |
| 2012/0164058 | A1 | 6/2012 | Uemura |
| 2014/0077223 | A1 | 3/2014 | Choe et al. |
| 2014/0080290 | A1 | 3/2014 | Eymery et al. |
| 2014/0124816 | A1 | 5/2014 | Choe et al. |

FOREIGN PATENT DOCUMENTS

| | | |
|---|---|---|
| CN | 1641835 A | 7/2005 |
| CN | 1664179 A | 9/2005 |
| CN | 1954101 A | 4/2007 |
| CN | 101393958 A | 3/2009 |
| CN | 101432471 A | 5/2009 |
| CN | 101558187 A | 10/2009 |
| CN | 101925696 A | 12/2010 |
| EP | 1576210 B1 | 2/2010 |
| JP | H10-312971 A | 11/1998 |
| JP | 2005-012171 A | 1/2005 |
| JP | 2005-225681 A | 8/2005 |
| JP | 2006-131454 A | 5/2006 |
| JP | 2006-169024 A | 6/2006 |
| JP | 2008-150239 A | 7/2008 |
| JP | 2010-037153 A | 2/2010 |
| JP | 2010-171273 A | 8/2010 |
| JP | 2011-132110 A | 7/2011 |
| JP | 2012-197194 A | 10/2012 |
| JP | WO 2013/021606 A1 | 3/2015 |
| WO | WO 03/072856 A1 | 9/2003 |
| WO | WO 2012/136665 A1 | 10/2012 |

OTHER PUBLICATIONS

Japanese Office Action dated Aug. 6, 2014 with a partial English translation.
United States Notice of Allowance dated May 22, 2015 in co-pending U.S. Appl. No. 14/300,927.
Specification, claims and Drawings for U.S. Appl. No. 14/300,927.
Specification, claims and Drawings for U.S. Appl. No. 14/295,204.
United States Office Action dated Aug. 19, 2014 in U.S. Appl. No. 12/926,995.
Japanese Office Action for Japanese Patent Application No. 2012-062530 dated Jun. 3, 2014 with a partial English translation thereof.
Japanese Office Action for Japanese Patent Application No. 2012-062268 dated Jun. 3, 2014 with a partial English translation thereof.
Chinese Office Action dated Apr. 21, 2016 with an English translation thereof.
Japanese Office Action dated May 10, 2016, with a partial English translation.
United States Office Action dated Jul. 27, 2016 in U.S. Appl. No. 14/295,204.
Chinese Office Action dated Sep. 21, 2016 with an English translation.

* cited by examiner

Cross-section CL after growth

Cross-section CL after growth

METHOD FOR PRODUCING A GROUP III NITRIDE SEMICONDUCTOR SINGLE CRYSTAL AND METHOD FOR PRODUCING A GAN SUBSTRATE

BACKGROUND OF THE INVENTION

Field of the Invention

The present invention relates to a method for producing a Group III nitride semiconductor single crystal and to a method for producing a GaN substrate. More particularly, the invention relates to a method for producing a Group III nitride semiconductor single crystal and to a method for producing a GaN substrate, which methods employ a flux method.

Background Art

A variety of methods for producing a semiconductor crystal are known, and examples thereof include vapor phase growth methods such as metalorganic chemical vapor deposition (MOCVD) and hydride vapor phase epitaxy (HVPE), molecular beam epitaxy (MBE), and liquid phase epitaxy (LPE). One technique of LPE is a flux method employing an Na flux. In the Na flux method, a molten mixture of Na (sodium) and Ga (gallium) is reacted with nitrogen at about 800° C. and some tens of atmospheres, for the growth of a GaN crystal.

In the Na flux method, a seed crystal is generally employed. Examples of the seed crystal employed in the method include a GaN substrate and a so-called template substrate, composed of a sapphire substrate and a GaN layer formed thereon through HVPE or a similar technique. Patent Document 1 discloses use, as a seed crystal, of a template substrate composed of a base substrate and an underlayer film formed thereon. The base substrate of the template substrate is made of sapphire or a similar material, and the underlayer film is formed of GaN, AlN, AlGaN, GaN/AlN, etc.

Patent Document 2 discloses an Na flux method which includes adding C (carbon) to a molten mixture. Through addition of carbon, generation of miscellaneous crystals is prevented, and nitrogen solubility is enhanced. However, mechanisms thereof have not been elucidated in detail.

Patent Document 1: Japanese Patent Application Laid-Open (kokai) No. 2006-131454

Patent Document 2: Japanese Patent Application Laid-Open (kokai) No. 2011-132110

The Na flux method has a drawback in that a GaN seed crystal is molten (i.e., undergoes melting back) during the period from a start of crystal growth to the time when the nitrogen concentration of the molten mixture reaches a super-saturation level. When melting back occurs, the temperature distribution profile and composition of the molten mixture vary, and the surface of the seed crystal fails to have uniformity in thickness. Particularly in the case of addition of carbon to the molten mixture, the GaN seed crystal more readily undergoes melting back, and etching proceeds locally, thereby considerably impairing surface flatness, which is problematic. When a template substrate is employed as a seed crystal, in some cases, the template substrate partially undergoes melting back, and a part of the sapphire substrate surface is exposed. On the exposed area, GaN cannot grow.

In order to avoid the influence of melting back, the thickness of the GaN layer formed on the sapphire substrate is conventionally adjusted to as thick as 5 to 30 μm. However, forming such a thick GaN layer requires a long period of time, thereby impairing template substrate pro-ductivity. It is true that formation of a thick GaN layer avoids a problem that a GaN-non-growing area is provided due to exposure of the sapphire substrate through melting back. However, the seed crystal surface fails to have uniformity in thickness. Thus, uniform crystal growth of GaN cannot be attained.

Patent Document 1 discloses that, in order to suppress melting back during crystal growth of GaN, the operation temperature is maintained at a level lower than the growth temperature, and then the temperature is elevated to the growth temperature. However, when the growth temperature is lowered, undesired miscellaneous crystals are formed. Patent Document 1 also discloses that melting back occurs not only in the case of GaN but also in the case of AlN. Therefore, melting back might possibly occur also in the case of AlGaN.

However, in contrast to the conceivable melting back of AlGaN estimated from Patent Document 1, the present inventors have found that no substantial melting back occurs in the case of AlGaN, and that the amount of melting back of the seed crystal is suppressed to 500 nm or less. The inventors have further found that the quality of a crystal formed on a seed crystal can be remarkably improved by reducing the amount of melting back of the seed crystal to 500 nm or less.

Meanwhile, in the case where a GaN single crystal is grown on an underlayer through a flux method, the crystal properties of the GaN single crystal are inherited from those of the underlayer. That is, the dislocation density of the single crystal to be formed is inherited from that of the underlayer. This feature is the same in the case of the growth disclosed in Patent Document 1. In this case, the dislocation density of the GaN single crystal is about $1 \times 10^6/cm^2$, and a smaller dislocation density is preferred. For example, a dislocation density of $1 \times 10^5/cm^2$ or less is preferred. Thus, in order to produce a GaN single crystal having a smaller dislocation density, the dislocation density must be considerably reduced during the growth of a GaN single crystal.

Meanwhile, when a GaN single crystal is grown through a flux method, the underlayer undergoes melting back. Generally, the surface of the underlayer which has undergone melting back is not flat and has irregularities. In the subsequent growth of a semiconductor single crystal, some dislocations are bent, and, as a result, dislocations extending from the irregularities decrease. Although melting back can reduce a part of dislocations, the effect of reduction is not sufficient. Since melting back occurs in a nonuniform manner, difficulty is encountered in reduction of dislocations in the entire wafer.

SUMMARY OF THE INVENTION

The present invention has been conceived in order to overcome the aforementioned drawbacks involved in conventional techniques. Thus, an object of the present invention is to provide a method for producing a Group III nitride semiconductor single crystal having excellent crystallinity, the method including controlling melting back. Another object of the invention is to provide a method for producing a GaN substrate having excellent crystallinity, the method including controlling melting back.

In a first aspect of the invention, there is provided a method for producing a Group III nitride semiconductor single crystal, the method comprising:

a seed crystal preparation step of preparing a seed crystal, which step comprises forming a mask layer made of $Al_X In_Y Ga_{(1-X-Y)}N$ (0<X, 0≤Y, X+Y≤1) on an underlayer, to thereby form a seed crystal in which a portion of the underlayer is covered with the mask layer and in which the remaining portion of the underlayer is not covered with the mask layer;

a seed crystal etching step of melting back the exposed portion of the underlayer which is not covered with the mask layer in a melt containing at least an alkali metal; and a semiconductor single crystal formation step of growing a Group III nitride semiconductor single crystal on the seed crystal in a molten mixture containing at least a Group III metal and an alkali metal.

In the above method for producing a Group III nitride semiconductor single crystal, the remaining portion of the underlayer which is not covered with the mask layer is gradually dissolved in the flux, as the inside temperature of the crucible is elevated. Then, a Group III nitride semiconductor single crystal is formed from the mask layer of the seed crystal as a growth starting point. Therefore, dislocations of the remaining portion of the underlayer which is not covered with the mask layer are virtually uninherited by the Group III nitride semiconductor single crystal.

A second aspect of the invention is a specific embodiment of the method for producing a Group III nitride semiconductor single crystal of the first aspect, wherein, in the seed crystal etching step, a facet plane of the underlayer is exposed through melting back.

A third aspect of the invention is a specific embodiment of the method for producing a Group III nitride semiconductor single crystal of the second aspect, wherein, in the semiconductor single crystal formation step, the Group III nitride semiconductor single crystal is grown on the seed crystal such that the facet plane is not buried with the Group III nitride semiconductor single crystal.

According to the third aspect, cavities are left (i.e., spaces are provided) in the remaining portion of the underlayer which is not covered with the mask layer. As used herein, the term "space" refers to a portion in which no semiconductor crystal has been grown (i.e., a non-crystal portion) and does not refer to a space filled with a gas such as air. Actually, each space is filled with a flux. By virtue of such a non-crystal portion, dislocations are not inherited from the underlayer by the formed semiconductor single crystal. Meanwhile, since the peel strength between the non-crystal portions and the semiconductor single crystal is weak, the formed semiconductor single crystal can be readily separated from the growth substrate.

A fourth aspect of the invention is a specific embodiment of the method for producing a Group III nitride semiconductor single crystal of the third aspect, wherein, in the semiconductor single crystal formation step, a non-crystal portion defined by the facet plane and the bottom surface of the Group III nitride semiconductor single crystal is formed.

A fifth aspect of the invention is a specific embodiment of the method for producing a Group III nitride semiconductor single crystal of the fourth aspect, wherein the non-crystal portion is a space filled with a molten mixture.

A sixth aspect of the invention is a specific embodiment of the method for producing a Group III nitride semiconductor single crystal of the third aspect, wherein, in the seed crystal etching step, the c-plane of the underlayer is not exposed through melting back. According to the sixth aspect, the semiconductor single crystal does not cover the facet plane.

A seventh aspect of the invention is a specific embodiment of the method for producing a Group III nitride semiconductor single crystal of the second aspect, wherein, in the semiconductor single crystal formation step, the Group III nitride semiconductor single crystal is grown on the seed crystal such that the facet plane is buried with the Group III nitride semiconductor single crystal.

An eighth aspect of the invention is a specific embodiment of the method for producing a Group III nitride semiconductor single crystal of the seventh aspect, wherein, in the seed crystal etching step, the c-plane of the underlayer is exposed through melting back.

A ninth aspect of the invention is a specific embodiment of the method for producing a Group III nitride semiconductor single crystal of the seventh aspect, wherein the facet plane is a $\{1,1,-2,2\}$ plane.

A tenth aspect of the invention is a specific embodiment of the method for producing a Group III nitride semiconductor single crystal of the second aspect, wherein the facet plane is a $\{1,0,-1,1\}$ plane.

An eleventh aspect of the invention is a specific embodiment of the method for producing a Group III nitride semiconductor single crystal of the second aspect, wherein, in the seed crystal preparation step, a plurality of trenches are formed in the underlayer by removing an area of the mask layer through the full thickness and the corresponding area of the underlayer through a partial thickness.

A twelfth aspect of the invention is a specific embodiment of the method for producing a Group III nitride semiconductor single crystal of the second aspect, wherein, in the seed crystal preparation step, the mask layer is formed of an AlGaN layer. The AlGaN layer is virtually undissolved in the flux and realizes growth of a single crystal of high quality.

A thirteenth aspect of the invention is a specific embodiment of the method for producing a Group III nitride semiconductor single crystal of the second aspect, wherein, in the seed crystal preparation step, the Al compositional proportion X in the mask layer is adjusted to 0.02 to 1.00. When X falls within the range, the mask layer is not readily dissolved in the flux.

A fourteenth aspect of the invention is a specific embodiment of the method for producing a Group III nitride semiconductor single crystal of the second aspect, wherein, in the seed crystal preparation step, the thickness of the mask layer is adjusted to 2 nm to 2 µm. When the thickness falls within the range, the mask layer is more resistive to dissolution in the flux, to thereby attain growth of a high-quality single crystal.

A fifteenth aspect of the invention is a specific embodiment of the method for producing a Group III nitride semiconductor single crystal of the second aspect, wherein the seed crystal preparation step further includes, before formation of the mask layer, an underlayer formation step of forming a GaN layer as an underlayer. The underlayer can be dissolved through melting back.

In a sixteenth aspect of the present invention, there is provided a method for producing a Group III nitride semiconductor single crystal, which method comprises:

a seed crystal preparation step of preparing a seed crystal having an Al-containing Group III nitride semiconductor layer as an outermost layer;

a step of growing a Group III nitride semiconductor single crystal on the seed crystal through reaction of a molten mixture containing at least a Group III metal and an alkali metal with a gas containing at least nitrogen, while melting back of the seed crystal is suppressed to 500 nm or less.

The Group III metal is at least one species of Ga, Al, and In. Among them, Ga is particularly preferred. As an alkali metal, Na (sodium) is generally used. However, K (potassium) may also be used, or a mixture of Na and K may also be used. Alternatively, Li (lithium) or an alkaline earth metal may be used in combination with the alkali metal. To the molten mixture, a dopant may be added for controlling physical properties (e.g., conduction type and magnetism) of the Group III nitride semiconductor to be grown, promoting crystal growth, suppressing formation of miscellaneous crystals, controlling growth direction, etc. Particularly, C (carbon) is preferably added to the molten mixture. Through addition of C, formation of miscellaneous crystals is suppressed, and nitrogen solubility is enhanced, whereby crystal growth rate can be enhanced. Alternatively, Ge (germanium) or the like may be used as an n-type dopant, and Zn (zinc), Mg (magnesium), or the like may be used as a p-type dopant.

The amount of C added to the molten mixture is preferably 0.1 to 2 mol % based on the amount of alkali metal. When the amount of C falls within the range, the effect of addition of C can be fully attained. More preferably, the amount of C is 0.2 to 1.2 mol %. Particularly when the amount of C falls within the range, melting back of GaN in the lateral direction is enhanced.

The gas containing nitrogen is a gas of a compound containing nitrogen as an essential element (e.g., molecular nitrogen or ammonia), or a mixture of such gases. Alternatively, the nitrogen-containing gas may be diluted with an inert gas (e.g., rare gas).

No particular limitation is imposed on the structure of the seed crystal, so long as it has an Al-containing Group III nitride semiconductor layer (preferably an AlGaN layer) as an outermost layer. When the seed crystal is a substrate itself, the substrate serves as the outermost layer; and when the seed crystal is a deposited structure of a substrate and a layer or a plurality of layers stacked on the substrate, the layer most distal with respect to the substrate serves as the outermost layer. The AlGaN layer is preferably stacked on the GaN layer, since the surface flatness of the AlGaN layer increases. An additional layer may be interposed between the GaN layer and the AlGaN layer. Examples of such a structure include a template substrate having a growth substrate (e.g., sapphire substrate) and, sequentially stacked thereon, a GaN layer and an AlGaN layer, and a template substrate having a GaN substrate and an AlGaN layer stacked on the substrate.

The GaN layer or the AlGaN layer may be undoped, or doped with an n-type or a p-type impurity. In the case of a template substrate, a buffer layer (AlN, GaN, or AlGaN) is disposed between the growth substrate and the GaN layer.

The Al-containing Group III nitride semiconductor layer preferably has an Al compositional proportion with respect to the Group III metal (hereinafter may be referred to simply as Al compositional proportion) of 2 to 50 mol %. In other words, X in the compositional formula $Al_XGa_YIn_ZN$ ($0 \leq X, Y, Z \leq 1$, $X+Y+Z=1$) is preferably 0.02 to 0.5. When the Al compositional proportion is in excess of 50 mol %, miscellaneous crystals are formed in the molten mixture, and the crystallinity of the Group III nitride semiconductor crystal is impaired. When the Al compositional proportion is less than 2 mol %, the melting-back-suppressing effect of the Al-containing Group III nitride semiconductor layer cannot be fully attained. Thus, the Al compositional proportion is more preferably 3 to 10 mol %.

The thickness of the Al-containing Group III nitride semiconductor layer (before growth of the Group III nitride semiconductor crystal) is preferably 2 nm to 2 μm. When the thickness is in excess of 2 μm, formation of the Al-containing Group III nitride semiconductor layer requires a long period of time, thereby impairing seed crystal productivity and, further, the crystallinity of the formed Group III nitride semiconductor crystal. When the thickness is less than 2 nm, the melting-back-suppressing effect of the Al-containing Group III nitride semiconductor layer cannot be fully attained. Thus, the thickness is preferably 10 to 200 nm.

A seventeenth aspect of the invention is a specific embodiment of the method for producing a Group III nitride semiconductor single crystal of the sixteenth aspect, wherein the Al-containing Group III nitride semiconductor layer is an AlGaN layer.

An eighteenth aspect of the invention is a specific embodiment of the method for producing a Group III nitride semiconductor single crystal of the seventeenth aspect, wherein the Group III metal is Ga, the alkali metal is Na, and the Group III nitride semiconductor crystal to be grown is a GaN crystal.

A nineteenth aspect of the invention is a specific embodiment of the method for producing a Group III nitride semiconductor single crystal of the eighteenth aspect, wherein the seed crystal is a stacked structure having a GaN layer, and an AlGaN layer stacked on the GaN layer.

In a twentieth aspect of the invention, there is provided a method for producing a GaN substrate, the method comprising:

a seed crystal preparation step of preparing a seed crystal, which step comprises forming a mask layer made of $Al_XIn_YGa_{(1-X-Y)}N$ ($0<X$, $0 \leq Y$, $X+Y \leq 1$) on an underlayer, to thereby form a seed crystal in which a portion of the underlayer is covered with the mask layer and in which the remaining portion of the underlayer is not covered with the mask layer;

a seed crystal etching step of melting back the exposed portion of the seed crystal which is not covered with the mask layer in a melt containing at least an alkali metal;

a semiconductor single crystal formation step of growing a GaN single crystal on the seed crystal in a molten mixture containing at least a Group III metal and an alkali metal; and a semiconductor single crystal separation step of removing the GaN single crystal from the seed crystal.

In the above method for producing a GaN substrate, the remaining portion of the underlayer which is not covered with the mask layer is gradually dissolved in the flux, as the inside temperature of the crucible is elevated. Then, a GaN single crystal is formed from the mask layer of the seed crystal as a growth starting point.

The present invention enables provision of a method for producing a Group III nitride semiconductor single crystal having excellent crystallinity, and a method for producing a GaN substrate having excellent crystallinity, each method including controlling melting back.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
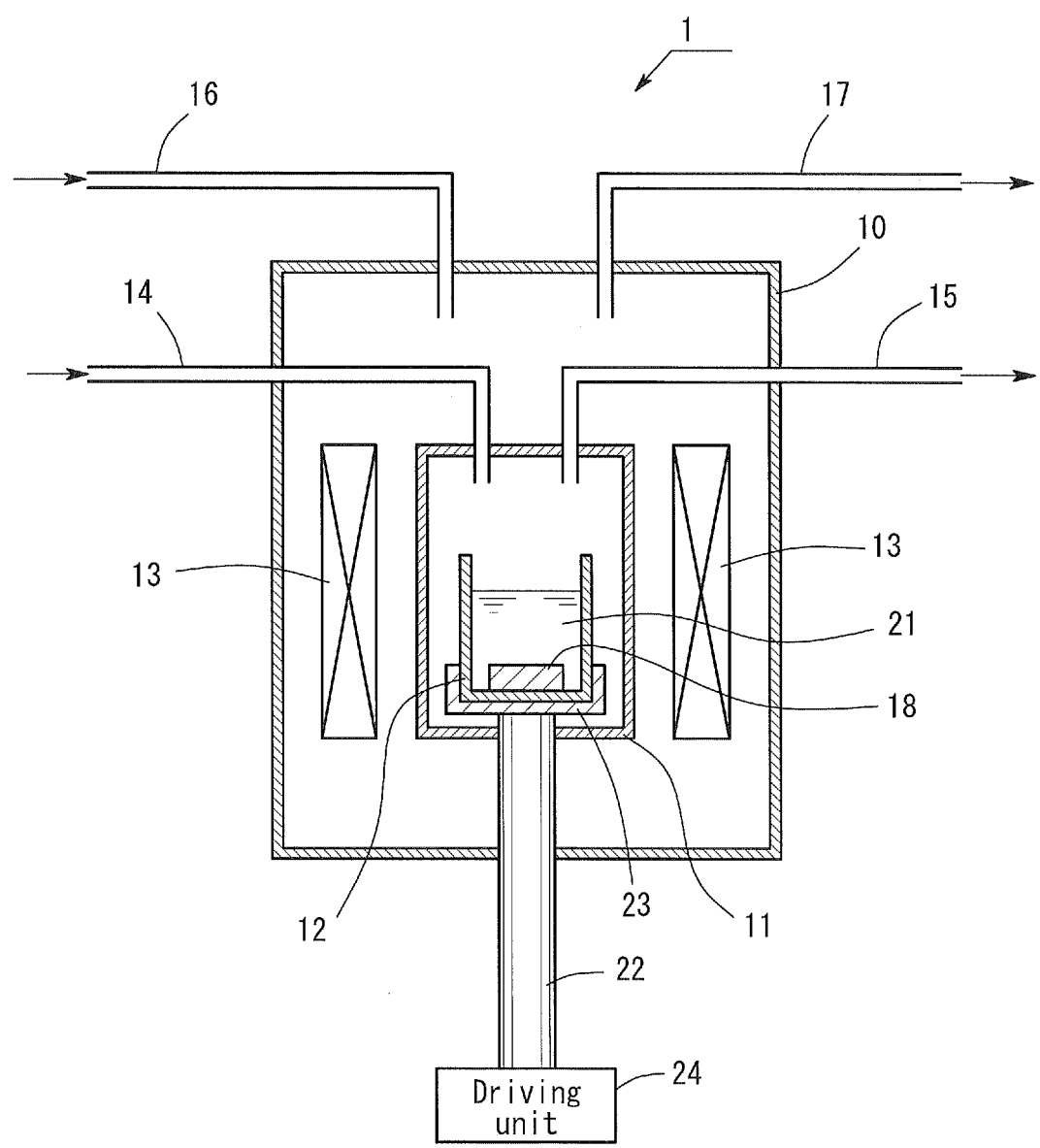
FIG. 1 is a sketch of an apparatus for producing a Group III nitride semiconductor single crystal employed in embodiments.

Hereinafter, specific embodiments of the present invention will be described with reference to the drawings. However, these embodiments are given only for the purpose of illustration and should not be construed as limiting the invention thereto. In the drawings, the thickness of each layer is not an actually measured one but a conceptual thickness.

Embodiments of the method for producing a GaN crystal having excellent crystallinity will be described. In the following embodiments, excellent crystallinity is attained by controlling melting back. However, the production method of the present invention is not limited to a GaN crystal and applicable to production of a Group III nitride semiconductor single crystal other than a GaN crystal. Characteristic features of Embodiments 1 to 3 reside in that a plurality of trenches are provided in an underlayer, and a GaN crystal is grown such that the crystal does not cover the trenches. Characteristic features of Embodiments 4 to 6 reside in that a plurality of trenches are provided in an underlayer, and a GaN crystal is grown such that the crystal covers the trenches. Characteristic features of Embodiments 7 and 8, which differ from those of Embodiments 1 to 6, reside in that a plurality of trenches are not provided in an underlayer, and a GaN crystal is grown on an AlGaN layer. Embodiment 9 is a method for producing a GaN substrate which method includes removal of a GaN crystal as described in Embodiment 1 to 3 from a seed crystal.

Embodiment 1

Embodiment 1 will be described. In Embodiment 1, a Group III nitride semiconductor single crystal is grown on a GaN substrate through a flux method. Embodiment 1 is described, with taking a GaN crystal as an example among Group III nitride semiconductor single crystals.

1. Single Crystal Production Apparatus

The configuration of the production apparatus for the GaN crystal of Embodiment 1 will next be described. As shown in FIG. 1, the production apparatus 1 includes a pressure container 10, a reaction vessel 11, a crucible 12, a heating apparatus 13, supply pipes 14, 16, and discharge pipes 15, 17.

The pressure container 10 is a pressure-resistant hollow cylinder made of stainless steel. To the pressure container 10, the supply pipe 16 and the discharge pipe 17 are connected. In the pressure container 10, the reaction vessel 11 and the heating apparatus 13 are disposed. Through placing the reaction vessel 10 in the pressure container, the reaction vessel 10 does not require particularly high pressure resistance. Thus, the reaction vessel 10 may be made of an inexpensive material, and recyclability is improved.

The reaction vessel 11 is made of SUS and has heat resistance. In the reaction vessel 11, the crucible 12 is placed. The crucible 12 is made of a material such as W (tungsten), Mo (molybdenum), BN (boron nitride), alumina, or YAG (yttrium aluminum garnet). The crucible 12 holds a molten mixture 2 containing Ga and Na, and a seed crystal 18 is maintained in the molten mixture 21.

To the reaction vessel 11, the supply pipe 14 and the discharge pipe 15 are connected. Through operation of valves (not illustrated) attached to the supply pipe 14 and the discharge pipe 15, there are performed aeration in and feeding nitrogen into the reaction vessel 11, and controlling the pressure inside the reaction vessel 11. Nitrogen is also supplied to the pressure container 10 via the supply pipe 16. Through operation of valves (not illustrated) attached to the supply pipe 16 and the discharge pipe 17, the nitrogen flow rate and discharge rate are controlled, whereby the pressure inside the pressure container 10 is virtually equalized with that of the reaction vessel 11. The temperature inside the reaction vessel 11 is controlled by means of the heating apparatus 13.

There is provided an apparatus which can rotate the crucible 12 so as to stir the molten mixture 21 contained in the crucible 12, whereby the molten mixture 21 is stirred during the growth of a GaN crystal. By virtue of the apparatus, the molten mixture 21 can have a uniform Na, Ga, or N concentration distribution profile, whereby a GaN crystal of uniform quality can be grown. The apparatus which can rotate the crucible 12 has a rotation axis 22, a table 23, and a driving unit 24. The rotation axis 22 extends from the inside of the reaction vessel 11 to the outside of the pressure container 10. The table 23 is disposed in the reaction vessel 10 and is connected to the rotation axis 22 so that it sustains the crucible 12. The driving unit 24 controls rotation of the rotation axis 22. The table 23 is rotated through rotation of the rotation axis 22 driven by the driving unit 24, whereby the crucible 12 sustained by the table 23 is rotated.

Meanwhile, when the employed reaction vessel 11 has pressure resistance, the pressure container 10 is not necessarily employed. In addition, in order to prevent vaporization of Na during growth of a GaN crystal, the crucible 12 may be provided with a lid. Instead of or in addition to the crucible 12 rotating means, crucible 12 swinging means may be provided. In the specification, the seed crystal 18 will be denoted with another reference numeral (T10, T20, etc.).

2. Method for Producing a Group III Nitride Semiconductor Single Crystal

The method of Embodiment 1 for producing a Group III nitride semiconductor single crystal includes the following steps:

(A) Seed crystal preparation step,
(A-3) Mask layer formation step,
(A-4) Trench formation step,
(B) Seed crystal etching step, and
(C) Semiconductor single crystal formation step. These steps will next be described in detail.

2-1. (A) Seed Crystal Preparation Step 2-1-1. (A-3) Mask Layer Formation Step

Figure 2:
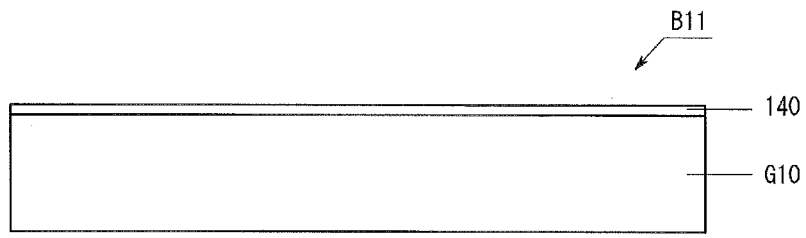
FIG. 2 is a sketch for describing a step (1) of the method for producing a Group III nitride semiconductor single crystal according to Embodiment 1.

Firstly, a GaN substrate G10 is provided. The GaN substrate G10 is a self-standing GaN substrate and has a dislocation density of about $5 \times 10^6/cm^2$. The GaN substrate G10 also serves as an underlayer on which a mask layer is to be formed. Thus, a mask layer 140 is formed on the GaN substrate G10. The mask layer 140 does not substantially undergo melting back by a flux which is supplied in the subsequent step, or has an etching rate which is considerably smaller than that of the underlayer. Eventually, a stacked structure B11 shown in FIG. 2 is produced.

The mask layer 140 has a composition of $Al_xIn_yGa_{(1-X-Y)}N$ ($0<X$, $0 \leq Y$, $X+Y \leq 1$). The mask layer 140 is preferably an AlGaN layer. The Al compositional ratio X of the mask layer 140 is preferably 0.02 to 1.0. Particularly, the Al compositional ratio X of the mask layer 140 is more preferably 0.03 to 0.50, as shown in Table 1. When the Al compositional ratio X is less than 0.03, the mask layer is readily melted back by a flux, whereas when the Al compositional ratio X is more than 0.50, the quality of the GaN crystal formed in the below-described semiconductor single crystal formation step is impaired.

As shown in Table 1, the mask layer 140 preferably has a thickness of 2 nm to 2 μm. When the thickness of the mask layer 140 is less than 2 nm, the effect of melting back as described below is poor, whereas when the thickness of the mask layer 140 is in excess of 2 μm, the quality of the GaN crystal formed in the below-described semiconductor single crystal formation step is impaired.

TABLE 1

| Al composition of mask layer | 0.03 to 0.50 |
| --- | --- |
| Thickness of mask layer | 2 nm to 2 μm |

2-1-2. (A-4) Trench Formation Step 2-1-2-1. Trench Formation Procedure

Figure 3:
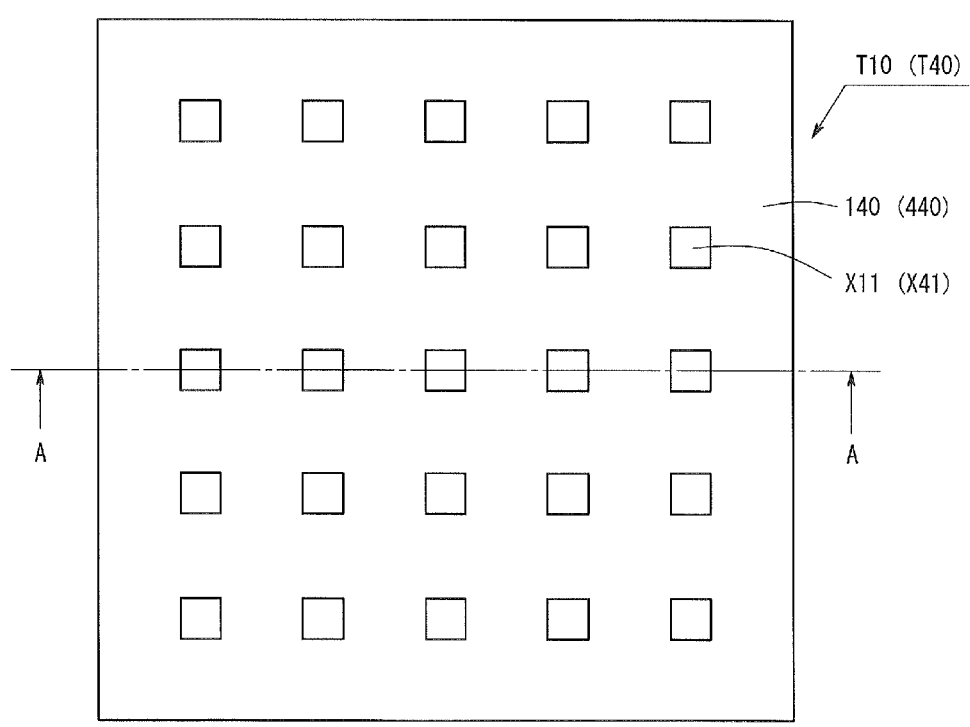
FIG. 3 is a sketch for describing a step (2) of the method for producing a Group III nitride semiconductor single crystal according to Embodiment 1.

Then, a plurality of trenches are formed in the stacked body B11. As shown in FIG. 3, a plurality of trenches X11 are formed. Each trench is formed by removing an area of the mask layer 140 through the full thickness and the corresponding area of the GaN substrate G10 through a partial thickness. In each trench X11, the GaN substrate G10 is exposed. Through the above procedure, a seed crystal T10 provided with a plurality of trenches X11 as shown in FIG. 3 is produced. The trenches X11 may be formed through, for example, photolithography. Firstly, patterning of resist is performed. Then, an area of the mask layer 140 through the full thickness and the corresponding area of the GaN substrate G10 through a partial thickness are removed through dry etching, to thereby form a plurality of trenches X11. After formation of the trenches X11, the mask layer 140 serves as a mask portion which covers the underlayer. Subsequently, the resist mask is removed, whereby the seed crystal T10 shown in FIG. 3 is produced. Then, the seed crystal T10 provided with a plurality of trenches X11 is washed.

2-1-2-2. Seed Crystal Provided with Trenches

As shown in FIG. 3, the trenches X11 are arranged in the mask layer 140 in a lattice-like pattern at constant intervals. However, the intervals are not necessarily constant. In FIG. 3, as viewed from the top of the mask layer 140, each of the trenches X11 of the seed crystal T10 has a square shape. However, the plane shape of the trench X11 is not limited to square, and may be another polygon such as hexagon, or a circle. The plane shape may be symmetric or asymmetric with respect to the center.

Figure 4:
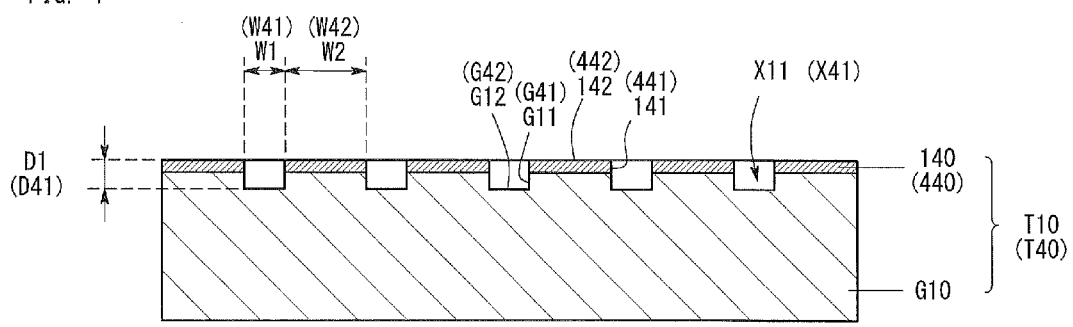
FIG. 4 is a sketch for describing a step (3) of the method for producing a Group III nitride semiconductor single crystal according to Embodiment 1.

FIG. 4 is a cross-section of the plan view of the seed crystal shown in FIG. 3 cut along line A-A. Each trench X11 is a non-through hole which penetrates the mask layer 140 through the full thickness and the GaN substrate G10 through a partial thickness. While the mask layer 140 has a thickness of 2 nm to 2 μm, each trench X11 has a depth D1 which is greater than the thickness of the mask layer 140. The depth of the trench X11 D1 is 1 μm to 5 μm. In the case of formation of the trenches X11, one requirement is that a part of the GaN substrate G10 (i.e., GaN layer) is exposed to the bottom surface of each trench X11.

The opening of each trench X11 has a width (opening width) W1 of 1 μm to 500 μm. The opening width W1 is preferably 20 μm to 100 μm. When the opening width is less than 1 μm, melting back does not occur to a sufficient depth. Generally, when {1,0,−1,1} plane is exposed through melting back, further melting back is impeded. When the opening width is in excess of 500 μm, controlling of melting back becomes difficult, to thereby fail to form a uniform interface.

The spacing between two adjacent trenches X11 (W2) is 2 μm to 500 μm. The spacing W2 is more preferably 20 μm to 100 μm. When the spacing W2 is less than 2 μm, melting back of the mask layer due to side etching may occur. When this melting back occurs, the area of the surfaces 142, which serve as starting points of lateral growth of a semiconductor layers formed in the below-described semiconductor single crystal formation step, become to be varied, to thereby possibly fail to obtain a semiconductor crystal of high crystallinity.

Each trench X11 has a bottom surface G12 and side surfaces G11, 141. The bottom surface G12 is a part of the GaN substrate G10. The side surfaces G11, 141 are generally orthogonal to the surface 142 of the mask layer 140. The side surfaces G11, 141 are formed to penetrate the mask layer 140 through the full thickness and the GaN substrate G10 through a partial thickness. Thus, the seed crystal T10 has a portion of the GaN substrate G10, which portion is covered with the mask layer 140, and the remaining portion of the GaN substrate G10, which portion is not covered with the mask layer 140.

2-2. (B) Seed Crystal Etching Step

Then, portions of the GaN substrate 10 exposed to the trenches X11 are partially dissolved through a flux method, which is a technique of liquid phase epitaxy. Table 2 shows the materials employed herein. The Ga ratio is preferably 30% or lower. The carbon ratio may be varied from 0 mol % to 2.0 mol %. That is, the flux may or may not contain carbon, and preferably has a carbon content of 0.01 mol % to 2.0 mol %. Notably, the amounts of the elements shown in Table 2 are merely examples, and other amounts may be employed.

Needless to say, the target semiconductor single crystal is a Group III nitride semiconductor single crystal, which may be GaN, AlGaN, InGaN, AlInGaN, etc. Firstly, the seed crystal T10 and the raw materials shown in Table 2 are weighed in a glovebox in which dew point and oxygen level are controlled. Notably, the amounts of the raw materials shown in Table 2 are merely examples, and other amounts may be employed. Then, the seed crystal T10 and the raw materials are placed in a crucible made of alumina, and the crucible is placed in a container made of SUS. The container is placed on a turn-table disposed in the pressure container. The pressure container is evacuated, and the pressure and temperature inside the container are elevated.

TABLE 2

| Ga | 20 g to 80 g |
|---|---|
| Na | 20 g to 80 g |
| C | 0.1 mol % to 2.0 mol % (based on Na) |

Table 3 shows the conditions employed in the above step and in the crucible. Actually, the temperature is 870° C., and the pressure is 3 MPa. Under these conditions, the aforementioned materials are melted to form a molten mixture. The mixture is stirred at 20 rpm. The direction of the rotation of the rotation member is appropriately altered. As a result, melting back occurs, whereby a semiconductor single crystal is grown on the seed crystal T10. The growth time is 30 hours.

TABLE 3

| Temperature | 850° C. to 900° C. |
|---|---|
| Pressure | 3 MPa to 10 MPa |
| Stirring condition | 0 rpm to 100 rpm |
| Growth time | 20 to 200 hours |

Figure 5:
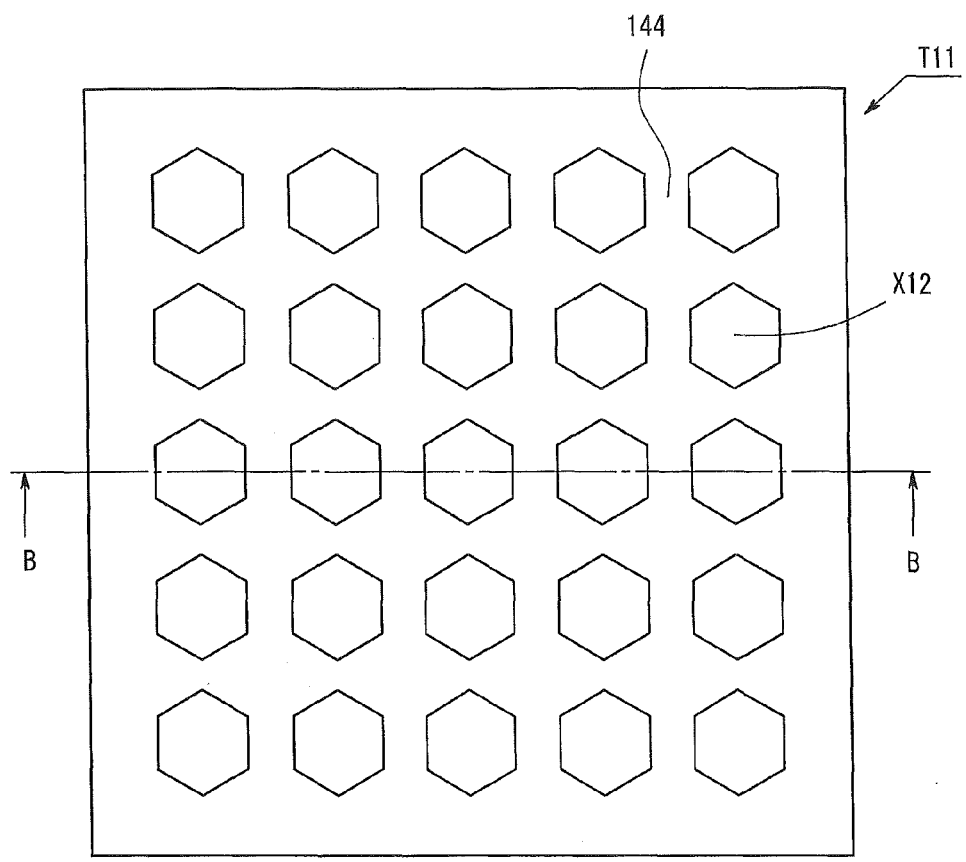
FIG. 5 is a sketch for describing a step (4) of the method for producing a Group III nitride semiconductor single crystal according to Embodiment 1.

During the above step, portions of the GaN substrate G10, which have been provided through melting back to serve as side surfaces of the trenches X11, are dissolved in the molten mixture. Specifically, the bottom surfaces G12 and the side surfaces G11 are dissolved in the flux. The mask layer 140 is difficult to dissolve in the flux. However, since the GaN substrate G10, serving as an underlayer with respect to the mask layer 140, is dissolved, the mask layer 140 is slowly dissolved on the lateral side. Thus, the dimensions of each trench X11 increase. More specifically, the depth of the trench X11 increases, and the width thereof increases slightly. Through melting back, the seed crystal T10 is etched, and the facet plane of the GaN substrate G10 is exposed. As shown in FIG. 5, trenches X12 each having a hexagonal cross-sectional shape as viewed from the top are provided, to thereby yield a seed crystal T11. In this case, the a-axis is orthogonal to the BB cross-section, and the m-axis is parallel to the BB cross-section.

Figure 6:
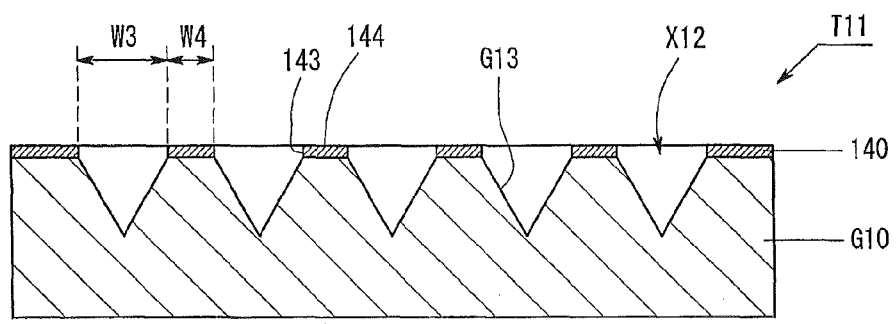
FIG. 6 is a sketch for describing a step (5) of the method for producing a Group III nitride semiconductor single crystal according to Embodiment 1.

FIG. 6 is a cross-section of a seed crystal shown in FIG. 5 cut along BB. Each trench X12 has inclined planes G13 and side surfaces 143. The c-plane of the GaN substrate G10 is not exposed to the trench X12. The inclined planes G13 are disposed so that the opening W3 becomes wider toward the surface 144. The inclined planes G13 have a characteristic similar to a {1,0,-1,1} plane. Each side surface 143 serves as a side surface of the mask layer 140.

2-3. (C) Semiconductor Single Crystal Formation Step

Figure 7:
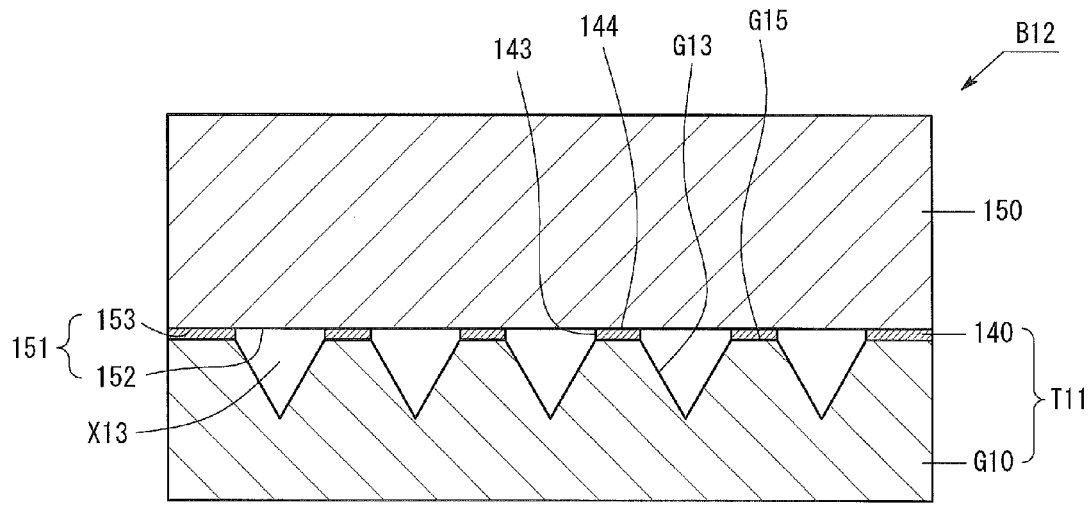
FIG. 7 is a sketch for describing a step (6) of the method for producing a Group III nitride semiconductor single crystal according to Embodiment 1.

As shown in FIG. 7, after the flux has been saturated through melting back and pressurization, a GaN layer 150 is grown in the molten mixture. The growth occurs after exposure of the inclined planes G13. Specifically, the GaN layer 150 is formed from the surface 144 of the mask layer 140 of the seed crystal as a growth starting point. In this case, the GaN layer 150 is grown from the surface 144 of the mask layer 140 in the lateral direction and the upward direction shown in FIG. 7. The underlayer has a surface virtually equivalent to a {1,0,-1,1} plane. Nitrogen (N) is difficult to feed to the bottom. Therefore, a single crystal is not formed in each trench X12, to thereby leave a space in the trench X12. Thus, portions of the GaN substrate G10 exposed to the trenches X11 are melted back by the flux, and the GaN layer 150 is grown such that the layer does not cover the trenches X12.

3. Produced Group III Nitride Semiconductor Single Crystal 3-1. GaN Single Crystal As described above, a GaN single crystal B12 as shown in FIG. 7 is produced through the embodiment of the method for producing a Group III nitride semiconductor single crystal. The GaN single crystal B12 has the GaN substrate G10, the mask layer 140, the GaN layer 150, and non-crystal portions X13.

Non-crystal portions X13 are portions in which no semiconductor single crystal has been formed. Each non-crystal portion X13 assumes a space. However, actually, the space is filed with a flux. Each non-crystal portion X13 is defined by the inclined planes G13 ({1,0,-1,1} plane) of the GaN substrate G10 and a portion 152 of the bottom surface 151 of the GaN layer 150.

A cross-section of the GaN substrate G10, serving as the underlayer, assumes a dent/protrusion shape having dent surfaces and protruded surfaces, which are alternatingly repeated, to form trenches. In each trench, the inclined planes G13 ({1,0,-1,1} plane) are exposed. Each inclined plane G13 serves as a dent surface of a hexagonal pyramid. In addition, the c-plane (protruded plane G15) is exposed to the protruded portions of the dent/protrusion shape. The mask layer 140 is disposed on the protruded plane G15 of the GaN substrate G10 serving as the underlayer.

3-2. Shape of Single Crystal

The bottom surface 151 of the GaN layer 150 is in contact with the mask layer 140 or the non-crystal portions X13. Portions 152 of the bottom surface 151 of the GaN layer 150 are in contact with the non-crystal portions X13. Each of the portions 152 of the bottom surface 151 of the GaN layer 150 which is in contact with the non-crystal portion X13 generally assumes the form of a hexagon as viewed from the top. The remaining portions 153 of the bottom surface 151 of the GaN layer 150 are in contact with the mask layer 140. The bottom surface 151 of the GaN layer 150 is flat. As described in the Examples hereinbelow, the thickness of the GaN layer 150 may be adjusted to about 1 mm.

3-3. Dislocation Density of Single Crystal

The GaN single crystal B12 of Embodiment 1 has non-crystal portions X13. Therefore, during the growth of the GaN layer 150 from the GaN substrate G10, dislocations do not extend from the portions 152 of the bottom surface 151 of the GaN layer 150. In other words, some dislocations are not inherited from the underlayer by the GaN substrate. However, dislocations are inherited from the mask layer 140. Thus, since inheritance of dislocations from the underlayer is partially inhibited, the GaN layer 150 has excellent crystallinity. Specifically, the GaN layer 150 has a dislocation density of $1\times10^4/cm^2$ or less. The dislocation density is uniform over the GaN layer 150, since a plurality of trenches X11 are arranged in a regular manner.

3-4. Separability of Single Crystal

Figure 8:
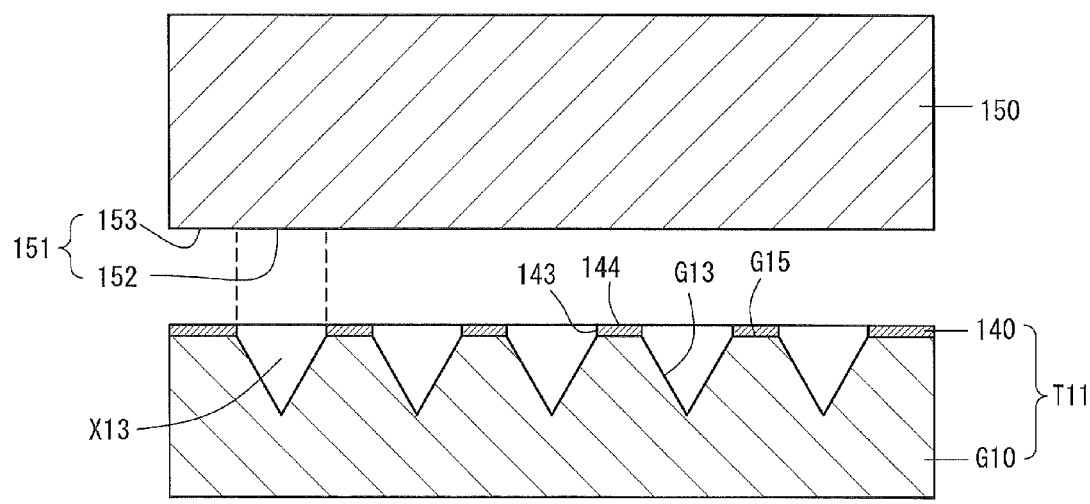
FIG. 8 is a sketch for describing a step (7) of the method for producing a Group III nitride semiconductor single crystal according to Embodiment 1.

Regarding the GaN single crystal B12 of Embodiment 1, the GaN layer 150 can be readily separated from the GaN substrate G10, since the stress attributed to warpage of the seed crystal or the like is applied mainly to the interface between the seed crystal and the single crystal. In some cases, the seed crystal is spontaneously removed from the single crystal at the time of temperature lowering performed during crystal growth. Alternatively, by applying slight impact to the stacked body after crystal growth, the seed crystal may be removed from the single crystal. FIG. 8 shows the GaN layer 150 and the seed crystal T11 after separation. Thus, the GaN layer 150 is readily removed from the GaN substrate G10, by virtue of non-crystal portions X13 provided between the growth substrate and the GaN layer 150.

As described above, portions which readily undergo melting back and portions having resistance to melting back are intentionally provided in order to intercept inheritance of dislocations, whereby a Group III nitride semiconductor single crystal which has excellent crystallinity and which can be readily separated from the growth substrate can be produced.

4. Control of Melting Back

Melting back is continuously performed until the nitrogen concentration of the flux reaches the saturation level. Thus, the degree of melting back may be modulated by modifying the conditions shown in Table 4. Through modification of these conditions, the GaN layer 150 which does not cover the trenches X12 can be formed. Notably, the same conditions as those shown in Table 4 may be employed in the below-described embodiments.

TABLE 4

Temperature
Compositional ratio (Ga/Na) of solution
Nitrogen pressure
Time
Carbon concentration 5. Variation 5-1. Group III Nitride Semiconductor Single Crystal In Embodiment 1, a GaN layer 150 is formed. However, the method of the invention may be applied to production of other Group III nitride semiconductor single crystals. That is, the production method of the invention is applicable to production of single-crystal $Al_xIn_yGa_{(1-X-Y)}N$ (0≤X, 0≤Y, X+Y≤1).

5-2. Seed Crystal Etching Step and Semiconductor Single Crystal Formation Step

In Embodiment 1, the seed crystal etching step and the semiconductor single crystal formation step are sequentially performed in one crucible. Actually, when sequential treatments are performed in one crucible under the conditions shown in Table 3, the seed crystal etching step and the semiconductor single crystal formation step can be performed continuously. However, these two steps may be performed separately. Specifically, a seed crystal which has undergone melting back in the seed crystal etching step is removed from a crucible, and a melt is supplied to the crucible, where the semiconductor single crystal formation step is performed. In the above format, different melts may be used in the seed crystal etching step and the semiconductor single crystal formation step. In this case, the seed crystal etching step is performed by use of a melt containing at least an alkali metal, while the semiconductor single crystal formation step is performed in a molten mixture containing at least a Group III metal and an alkali metal.

6. Summary of Embodiment 1

As described above, a seed crystal provided with trenches X11 is used as the seed crystal T10 for the flux method in the method for producing a Group III nitride semiconductor single crystal according to Embodiment 1. Thus, the GaN substrate G10 which mainly undergoes melting back and the mask layer 140 which is resistive to melting back are formed. Therefore, no single crystal is formed in each trench X12, and instead, the trench X12 is provided with a non-crystal portion X13. That is, no dislocations are transferred to the GaN layer 150 disposed on the non-crystal portions X13. The thus-formed GaN single crystal has satisfactorily low dislocation density. Thus, a Group III nitride semiconductor single crystal of excellent crystallinity can be formed.

Notably, Embodiment 1 is given for the purpose of illustration only, and needless to say, those skilled in the art can conceive various modifications and variations, so long as the scope of the invention is not impaired. The number of trenches provided in the seed crystal is actually a larger number, as compared with the number of trenches illustrated in the drawings.

Embodiment 2

Embodiment 2 will be described. In Embodiment 2, the same procedure as that of Embodiment 1 is repeated, except that the growth substrate is a GaN template formed on a sapphire substrate. Thus, the same description in relation to Embodiment 1 will be omitted.

1. Method for Producing a Group III Nitride Semiconductor Single Crystal

The method of Embodiment 2 for producing a Group III nitride semiconductor single crystal includes the following steps:

(A) Seed crystal preparation step,
(A-1) Low-temperature-deposited buffer layer formation step
(A-2) Underlayer formation step,
(A-3) Mask layer formation step,
(A-4) Trench formation step,
(B) Seed crystal etching step, and
(C) Semiconductor single crystal formation step. These steps will next be described in detail.

1-1. (A) Seed Crystal Preparation Step 1-1-1. (A-1) Low-Temperature-Deposited Buffer Layer Formation Step Firstly, a low-temperature-deposited buffer layer 220 is formed on a sapphire substrate S20 serving as a growth substrate (see FIG. 9). The sapphire substrate S20 is formed of c-plane sapphire. The low-temperature-deposited buffer layer 220 is formed on the sapphire substrate S20 through epitaxial growth. Examples of the epitaxial growth technique include metalorganic chemical vapor deposition (MOCVD), hydride vapor phase epitaxy (HYPE), molecular beam epitaxy (MBE), and liquid phase epitaxy. Any of these techniques may be employed. The low-temperature-deposited buffer layer 220 is a GaN layer. The layer 220 may be an AlN layer.

1-1-2. (A-2) Underlayer Formation Step

Subsequently, a GaN layer 230 is formed on the low-temperature-deposited buffer layer 220 (see FIG. 9). The GaN layer 230 serves as an underlayer. The GaN layer 230 preferably has a thickness of 1.5 µm to 20 µm. In the underlayer formation step, any of metalorganic chemical vapor deposition (MOCVD), hydride vapor phase epitaxy (HYPE), molecular beam epitaxy (MBE), and liquid phase epitaxy may be employed.

1-1-3. (A-3) Mask Layer Formation Step

Figure 9:
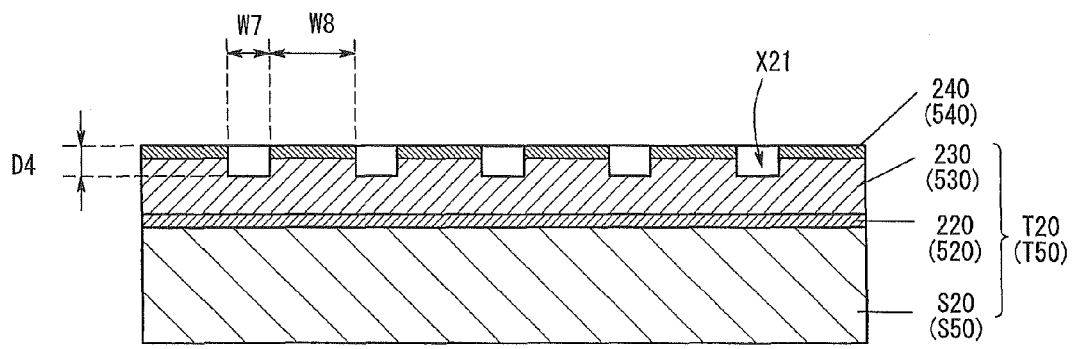
FIG. 9 is a sketch for describing a step (1) of the method for producing a Group III nitride semiconductor single crystal according to Embodiment 2.

Then, a mask layer 240 is formed on the GaN layer 230 (see FIG. 9). The mask layer 240 may have the same Al compositional proportion and thickness as shown in Table 1.

1-1-4. (A-4) Trench Formation Step

Subsequently, trenches X21 are formed through photolithography, whereby a seed crystal T20 shown in FIG. 9 is produced. The trenches X21 are the same as trenches X11 of Embodiment 1 (see FIG. 4). Each trench X21 is a non-through hole which penetrates the mask layer 240 through the full thickness and the GaN substrate 230 through a partial thickness. The width of each trench X21 (opening width W7) is the same as the opening width W1 of Embodiment 1 (see FIG. 4). The depth (D4) of each trench X21 is the same as the depth D1 of Embodiment 1 (see FIG. 4). The spacing between two adjacent trenches X21 (W8) is the same as the spacing W2 of Embodiment 1 (see FIG. 4). Needless to say, however, these parameters may be different from those of Embodiment 1.

1-2. (B) Seed Crystal Etching Step

Subsequently, a semiconductor single crystal layer is formed on the seed crystal T20 through a flux method, which is a technique of liquid phase epitaxy. The same raw materials as shown in Table 2 may be used. The same conditions of the flux method as shown in Table 3 may be employed.

Figure 10:
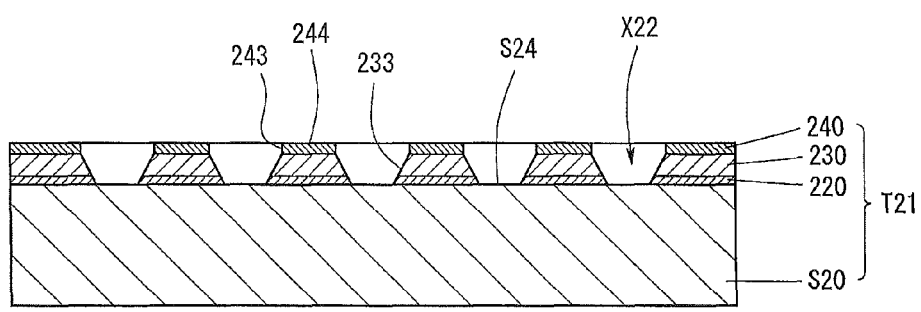
FIG. 10 is a sketch for describing a step (2) of the method for producing a Group III nitride semiconductor single crystal according to Embodiment 2.

Through melting back, exposed portions of the GaN layer 230 are preferentially dissolved. As a result, the depth of the trench X21 increases, and the width thereof slightly increases. Thus, the dimensions of each trench X21 increase as shown in FIG. 10, to thereby provide trenches X22. Each trench X22 is defined by a bottom surface S24, inclined planes 233, and side surfaces 243. The bottom surface S24 is a c-plane of the sapphire substrate S20. That is, the c-plane of the sapphire substrate S20 is exposed. Each of the inclined planes 233 assumes a $\{1,0,-1,1\}$ plane.

1-3. (C) Semiconductor Single Crystal Formation Step

Figure 11:
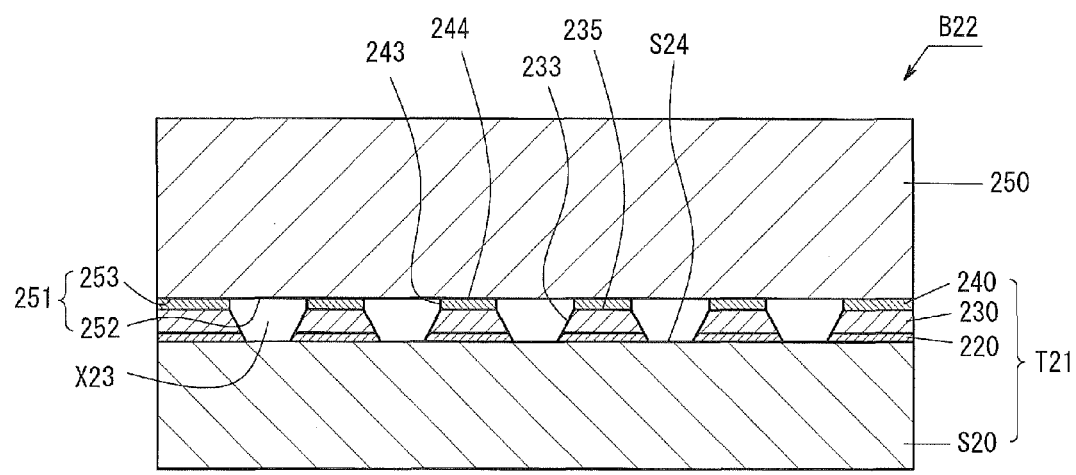
FIG. 11 is a sketch for describing a step (3) of the method for producing a Group III nitride semiconductor single crystal according to Embodiment 2.

After the flux has been saturated through melting back, a GaN layer 250 is grown from the surface 244 of the mask layer 240 of the seed crystal as a growth starting point. GaN is not formed in the trenches X22. The GaN layer 250 is grown from the surface of the mask layer 240 in the lateral direction and the upward direction shown in FIG. 11. In this case, the GaN layer 250 is formed such that the layer does not cover the trenches X22, and GaN is not formed in the trench X22, and the trenches X22 serve as non-crystal portions X23.

2. Produced Group III Nitride Semiconductor Single Crystal 2-1. GaN Single Crystal As described above, a GaN single crystal B22 as shown in FIG. 11 is produced through the embodiment of the method for producing a Group III nitride semiconductor single crystal. The GaN single crystal B22 has the sapphire substrate S20, the low-temperature-deposited buffer layer 220, the GaN layer 230, the mask layer 240, the GaN layer 250, and the non-crystal portions X23.

Non-crystal portions X23 are portions in which no semiconductor single crystal has been formed. Each non-crystal portion X23 assumes a space. However, actually, the space is filed with a flux. Each non-crystal portion X23 is defined by the inclined planes 233 ($\{1,0,-1,1\}$ plane) of the GaN layer 230, a bottom surface S24, side surfaces 243, and a portion 252 of the bottom surface 251 of the GaN layer 250.

A cross-section of the GaN layer 230, serving as the underlayer, assumes a dent/protrusion shape having dent surfaces and protruded surfaces, which are alternatingly repeated, to form trenches. In each trench, the inclined plane 233 ($\{1,0,-1,1\}$ plane) are exposed. Each inclined plane 233 serves as a dent surface of a hexagonal pyramid. In addition, the c-plane (protruded plane 235 is exposed to the protruded portions of the dent/protrusion shape. The mask layer 240 is disposed on the protruded plane 235 of the GaN layer 230 serving as the underlayer.

2-2. Shape of Single Crystal

The bottom surface 251 of the GaN layer 250 is in contact with the mask layer 240 or the non-crystal portions X23. Portions 252 of the bottom surface 251 of the GaN layer 250 are in contact with the non-crystal portions X23. Each of the portions 252 of the bottom surface 251 which is in contact with the non-crystal portion X23 generally assumes the form of a hexagon as viewed from the top. The remaining portions 253 of the bottom surface 251 of the GaN layer 250 are in contact with the mask layer 240. The bottom surface 251 of the GaN layer 250 is flat. As described in the Examples hereinbelow, the thickness of the GaN layer 250 may be adjusted to about 1 mm.

2-3. Dislocation Density of Single Crystal

The GaN single crystal B22 of Embodiment 2 has non-crystal portions X23. Therefore, during the growth of the GaN layer 250 from the sapphire substrate S20, dislocations do not extend from the portions 252 of the bottom surface 251 of the GaN layer 250. In other words, some dislocations are not inherited from the underlayer to the GaN layer. However, dislocations are inherited from the mask layer 240. Thus, since inheritance of dislocations from the underlayer is partially inhibited, the GaN layer 250 has excellent crystallinity. Specifically, the GaN layer 250 has a dislocation density of $1 \times 10^4/\text{cm}^2$ or less. The dislocation density is uniform over the GaN layer 250, since a plurality of trenches X21 are arranged in a regular manner.

2-4. Separability of Single Crystal

Figure 12:
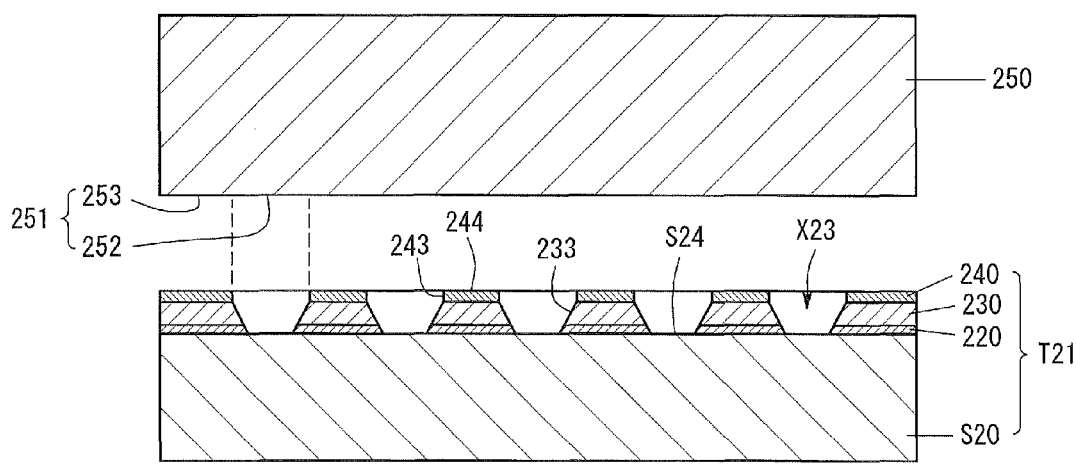
FIG. 12 is a sketch for describing a step (4) of the method for producing a Group III nitride semiconductor single crystal according to Embodiment 2.

Regarding the GaN single crystal B22 of Embodiment 2, the GaN layer 250 can be readily separated from the sapphire substrate S20, since the stress attributed to warpage of the seed crystal or the like is applied mainly to the interface between the seed crystal and the single crystal. In some cases, the seed crystal is spontaneously removed from the single crystal at the time of temperature lowering performed during crystal growth. Alternatively, by applying slight impact to the stacked body after crystal growth, the seed crystal may be removed from the single crystal. FIG. 12 shows the GaN layer 250 and the seed crystal T21 after separation. Thus, the GaN layer 250 is readily removed from the sapphire substrate S20, by virtue of non-crystal portions X23 provided between the growth substrate and the GaN layer 250.

As described above, portions which readily undergo melting back and portions having resistance to melting back are intentionally provided in order to intercept inheritance of dislocations, whereby a Group III nitride semiconductor single crystal which has excellent crystallinity and which can be readily separated from the growth substrate can be produced.

3. Variation 3-1. Group III Nitride Semiconductor Single Crystal

In Embodiment 2, a GaN layer 250 is formed. However, the method of the invention may be applied to production of other Group III nitride semiconductor single crystals. That is, the production method of the invention is applicable to production of single-crystal $Al_xIn_yGa_{(1-X-Y)}N$ ($0 \leq X$, $0 \leq X+Y \leq 1$).

4. Summary of Embodiment 2

As described above, a seed crystal provided with trenches X21 is used as the seed crystal T20 for the flux method in the method for producing a Group III nitride semiconductor single crystal according to Embodiment 2. Thus, the GaN layer 230 which mainly undergoes melting back and the mask layer 240 which is resistive to melting back are formed. Therefore, no single crystal is formed in each trench X22, and instead, the trench X22 is provided with a non-crystal portion X23. That is, no dislocations are transferred to the GaN layer 250 disposed on the non-crystal portions X23. The thus-formed GaN single crystal has satisfactorily low dislocation density. Thus, a Group III nitride semiconductor single crystal of excellent crystallinity can be formed.

Notably, Embodiment 2 is given for the purpose of illustration only, and needless to say, those skilled in the art can conceive various modifications and variations, so long as the scope of the invention is not impaired. The number of trenches provided in the seed crystal is actually a larger number, as compared with the number of trenches illustrated in the drawings.

Embodiment 3

Figure 13:
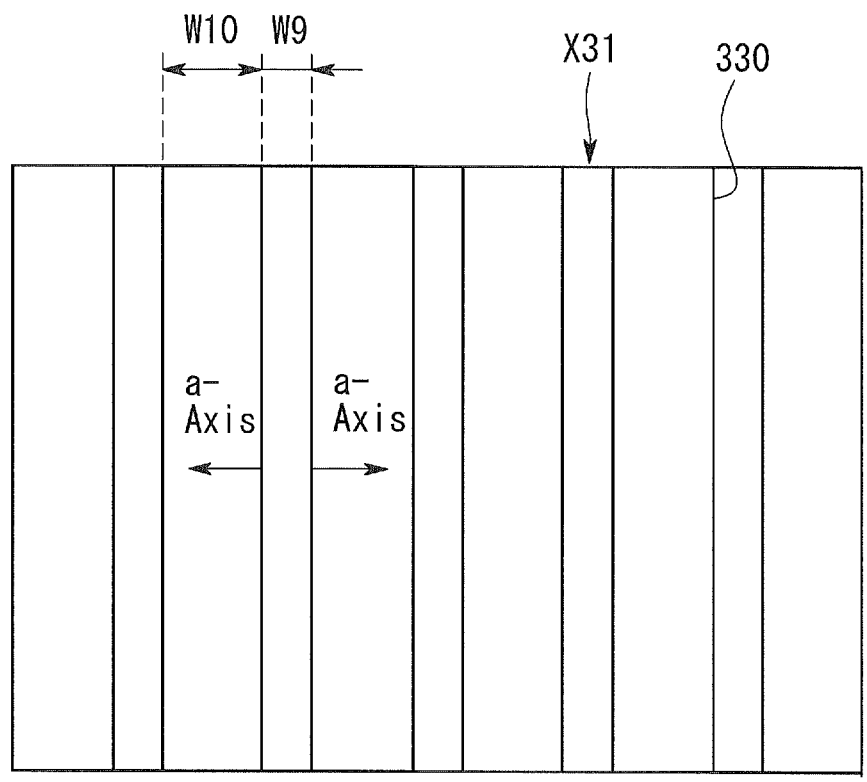
FIG. 13 is a sketch for describing a step of the method for producing a Group III nitride semiconductor single crystal according to Embodiment 3.

Embodiment 3 will be described. In Embodiment 3, trenches X31 are arranged in a stripe pattern as shown in FIG. 13. The side surfaces 330 of each trench X31 assume the a-plane of the GaN layer. In other words, the a-plane of the GaN layer is exposed to the side surfaces of the trench X31. In this case, the GaN a-plane is formed at high growth rate, and planarization can be readily attained. In FIG. 13, the opening width is denoted by W9, and the spacing is denoted by W10.

Through the above procedure, non-crystal portions are formed, whereby dislocations present in the formed Group III nitride semiconductor single crystal decrease. That is, a Group III nitride semiconductor single crystal of excellent crystallinity can be formed.

Embodiment 4

Embodiment 4 will be described. As described in relation to Embodiments 1 to 3, in Embodiment 4, a plurality of trenches are formed in the underlayer. During growth of a GaN crystal, the GaN crystal is formed such that the crystal covers a plurality of trenches.

1. Method for Producing a Group III Nitride Semiconductor Single Crystal

In Embodiment 4, a seed crystal T40, which has almost equivalent to the seed crystal T10 of Embodiment 1, is employed. However, the dimensions of the seed crystal T40 slightly differ from those of the seed crystal T10. The steps to formation of a plurality of trenches are the same as employed in Embodiment 1.

1-1. Seed Crystal Provided with Trenches

As shown in FIG. 3, the trenches X41 of the seed crystal T40 are arranged in the mask layer 440 in a lattice-like pattern at constant intervals. However, the intervals are not necessarily constant. In FIG. 3, as viewed from the top of the mask layer 440, each of the trenches X41 of the seed crystal T40 has a square shape. However, the plane shape of the trench X41 is not limited to square, and may be another polygon such as hexagon, or a circle. The plane shape may be symmetric or asymmetric with respect to the center.

FIG. 4 is a cross-section of the plan view of the seed crystal shown in FIG. 3 cut along line A-A. Each trench X41 is a non-through hole which penetrates the mask layer 440 through the full thickness and the GaN substrate G40 through a partial thickness. While the mask layer 440 has a thickness of 2 nm to 2 μm, each trench X41 has a depth D41 which is greater than the thickness of the mask layer 440. The depth of the trench X41 D41 is 1 μm to 5 μm. In the case of formation of the trenches X41, one requirement is that a part of the GaN substrate G40 (i.e., GaN layer) is exposed to the bottom surface of each trench X41.

The opening of each trench X41 has a width (opening width) W41 of 1 μm to 1,000 μm. When the opening width is less than 1 μm, or when the opening width is in excess of 1,000 μm, the effect of reducing dislocations is insufficient.

The spacing between two adjacent trenches X41 (W42) is 2 μm to 1,000 μm. The spacing W42 is more preferably 2 μm to 500 μm. When the spacing W42 is less than 2 μm, melting back of the mask layer due to side etching may occur. When this melting back occurs, the area of the surfaces 442, which serve as starting points of lateral growth of a semiconductor layers formed in the below-described semiconductor single crystal formation step, become to be varied, to thereby possibly fail to obtain a semiconductor crystal of high crystallinity.

Each trench X41 has a bottom surface G42 and side surfaces G41, 441. The bottom surface G42 is a part of the GaN substrate G40. The side surfaces G41, 441 are generally orthogonal to the surface 442 of the mask layer 440. The side surfaces G41, 441 are formed to penetrate the GaN substrate G40 through a partial thickness and the mask layer 440 through the full thickness.

1-2. (C) Semiconductor Single Crystal Formation Step

A semiconductor single crystal layer is formed on the seed crystal T40 through a flux method, which is a technique of liquid phase epitaxy. The materials employed herein are the same as shown in Table 2.

The conditions inside the crucible employed in the semiconductor single crystal formation step are the same as shown in Table 3. The growth time is 100 hours.

Figure 14:
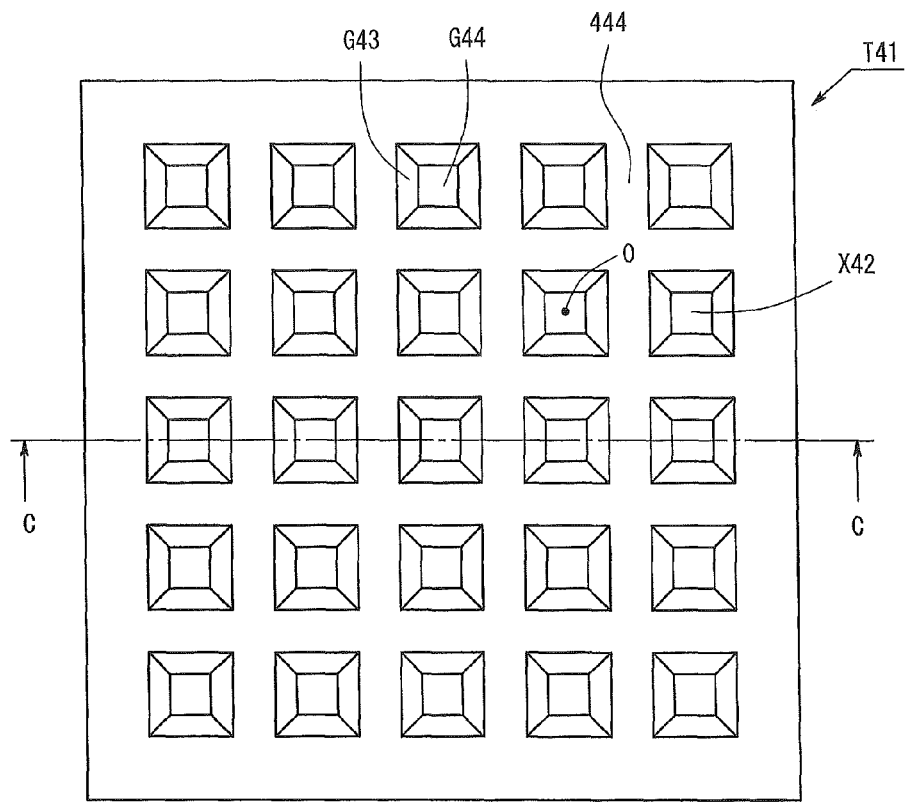
FIG. 14 is a sketch for describing a step (1) of the method for producing a Group III nitride semiconductor single crystal according to Embodiment 4.

During the semiconductor single crystal formation step, portions of the GaN substrate G40, which have been provided through melting back to serve as side surfaces of the trenches X41, are dissolved in the molten mixture at an initial stage. Specifically, the bottom surfaces G42 and the side surfaces G41 are dissolved in the flux. The mask layer 440 is difficult to dissolve in the flux. However, since the GaN substrate G40, serving as an underlayer with respect to the mask layer 440, is dissolved, the mask layer 440 is slowly dissolved on the lateral side. Thus, the dimensions of each trench X41 increase. More specifically, the depth of the trench X41 increases, and the width thereof increases slightly. As shown in FIG. 14, the seed crystal T41 provided with trenches X42 is produced. In this case, the a-axis is orthogonal to the CC cross-section, and the m-axis is parallel to the BB cross-section.

Figure 15:
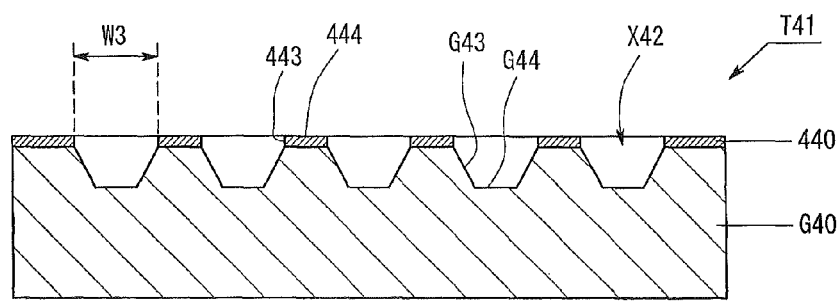
FIG. 15 is a sketch for describing a step (2) of the method for producing a Group III nitride semiconductor single crystal according to Embodiment 4.

FIG. 15 is a cross-section of a seed crystal shown in FIG. 14 cut along CC. Each trench X42 has a bottom surface G44, inclined planes G43, and side surfaces 443. The bottom surface G44 is a c-plane exposed to the GaN substrate G40. The inclined planes G43 are disposed so that the opening of each trench becomes wider toward the surface 444. The inclined planes G43 have a characteristic similar to a {1,0,-1,1} plane or a {1,1,-2,2} plane. Each side surface 443 serves as a side surface of the mask layer 440.

Figure 16:
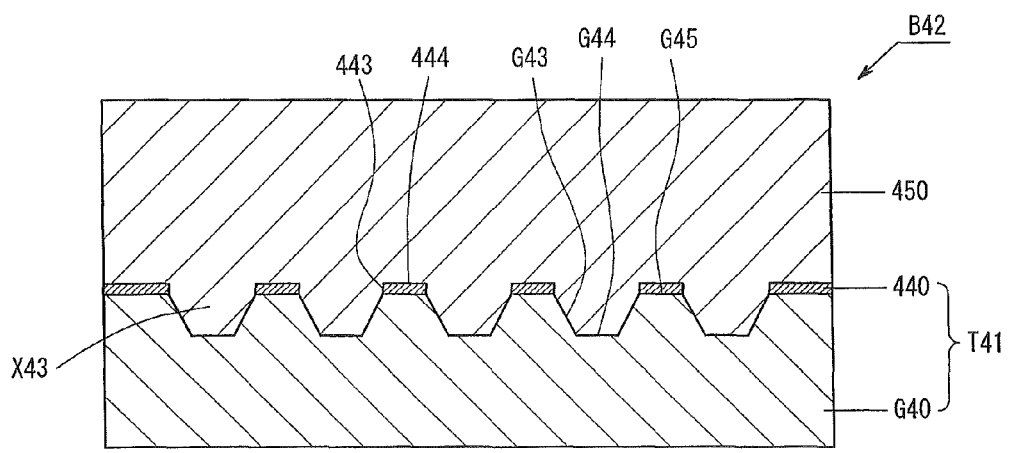
FIG. 16 is a sketch for describing a step (3) of the method for producing a Group III nitride semiconductor single crystal according to Embodiment 4.

As shown in FIG. 16, after the flux has been saturated through melting back and pressurization, a GaN layer 450 is grown. The growth occurs after exposure of the inclined planes G43 and the bottom planes G44. Specifically, the GaN layer 450 is formed from the surface 444, the inclined planes G43, and the bottom planes G44 of the mask layer 440, as growth starting points. In this case, the GaN layer 450 is grown from the surface 444 of the mask layer 440 in the lateral direction and the upward direction shown in FIG. 16. Also, GaN is formed in the trenches X42. That is, the GaN layer 450 is formed so as to cover the trenches X42. Thus, while portions of the GaN substrate G40 exposed to the trenches X41 are melted back by the flux, the GaN layer 450 is grown so as to cover the trenches X42. Each bottom surface G44 preferably has a depth of 5 μm or more.

2. Produced Group III Nitride Semiconductor Single Crystal 2-1. GaN Single Crystal As described above, a GaN single crystal B42 as shown in FIG. 16 is produced through the embodiment of the method for producing a Group III nitride semiconductor single crystal. The GaN single crystal B42 has the GaN substrate G40, the mask layer 440, and the GaN layer 450. A cross-section of the GaN substrate G40, serving as the underlayer, assumes a dent/protrusion shape having dent surfaces and protruded surfaces, which are alternatingly repeated, to form trenches. In each trench, a c-plane (bottom surface G44) is exposed. In addition, the c-plane (protruded plane G45) is exposed to the protruded portions of the dent/protrusion shape. To the area between a trench and a protruded portion, a {1,0,-1,1} plane (inclined plane G43) or a {1,1,-2,2} plane is exposed. The mask layer 440 is disposed on the protruded plane G45 of the GaN substrate G40 serving as the underlayer. The protruded portions X43 may be provided through polishing the GaN substrate G40.

2-2. Dislocation Density of Single Crystal

Figure 17:
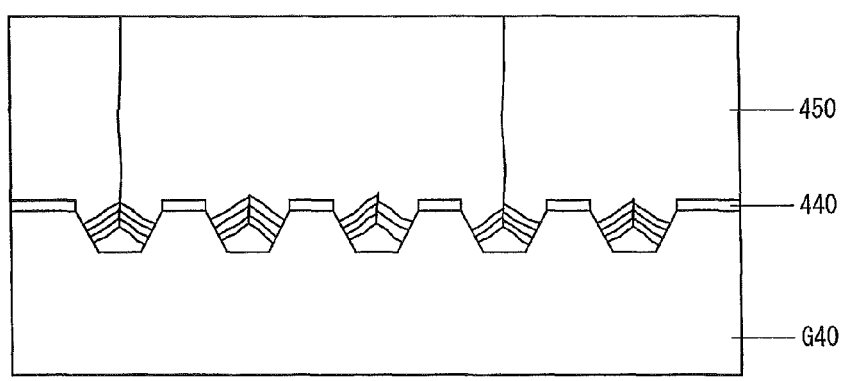
FIG. 17 is a sketch of threading dislocations in a Group III nitride semiconductor single crystal produced through the method for producing a Group III nitride semiconductor single crystal according to Embodiment 4.

FIG. 17 is a sketch of dislocations extending from the trenches X42 in the GaN layer 450. As shown in FIG. 17, dislocations extend from the {1,0,-1,1} plane and the {1,1,-2,2} plane of each trench X42 in the lateral direction in FIG. 17. The trench X42 has a dent surface assuming the form of a quadrangular pyramid. Thus, as shown in FIG. 17, the dislocations extend along the center axis of the quadrangular pyramid and are merged and combined together. After merging, some dislocations are extinguished, and the remaining dislocations extend upwardly in the semiconductor layer. Through repetition of such merging and combination, the number of dislocations decreases. Therefore, the GaN layer 450 has high crystallinity.

Specifically, the GaN layer 450 has a dislocation density of $1 \times 10^4/cm^2$ or less. The dislocation density is uniform over the GaN layer 450, since a plurality of trenches X41 are arranged in a regular manner. Thus, the GaN layer 450 produced according to the embodiment has considerably high crystallinity, since inheritance of dislocations from the underlayer is inhibited. As described in the Examples hereinbelow, the thickness of the produced GaN layer 450 may be adjusted to about 1 mm. As described above, portions which readily undergo melting back and portions having resistance to melting back are intentionally provided in order to merge dislocations, whereby a Group III nitride semiconductor single crystal which has excellent crystallinity and a large thickness can be produced.

2-3. Single Crystal Produced Through Conventional Flux Method

Figure 18:
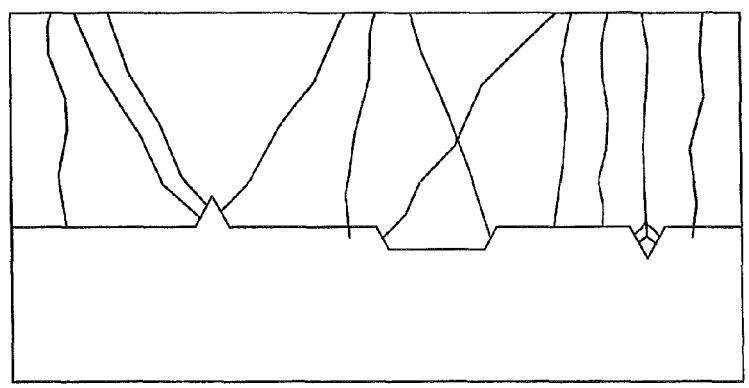
FIG. 18 is a sketch of threading dislocations in a Group III nitride semiconductor single crystal produced through a conventional method for producing a Group III nitride semiconductor single crystal.

For the purpose of comparison, dislocations of a single crystal produced through a conventional flux method will next be described. As shown in FIG. 18, according to a conventional flux method, the underlayer is provided with trenches or protrusions in a random manner. In this case, dislocations may be merged as in the case of Embodiment 4. However, the extent of merging is in sufficient, which differs from Embodiment 4, in which a single crystal is produced with intentionally merging dislocations.

3. Variation 3-1. Group III Nitride Semiconductor Single Crystal

In Embodiment 4, a GaN layer 450 is formed. However, the method of the invention may be applied to production of other Group III nitride semiconductor single crystals. That is, the production method of the invention is applicable to production of single-crystal $Al_xIn_yGa_{(1-X-Y)}N$ (0≤X, 0≤Y, X+Y≤1).

4. Summary of Embodiment 4

As described above, a seed crystal provided with trenches X41 is used as the seed crystal T40 for the flux method in the method for producing a Group III nitride semiconductor single crystal according to Embodiment 4. Thus, the GaN substrate G40 which mainly undergoes melting back and the mask layer 440 which is resistive to melting back are formed. Therefore, dislocations extending from each trench X42 of the GaN substrate G40 are merged together. As a result, dislocations are substantially untransferred to the formed GaN layer 450. Thus, a Group III nitride semiconductor single crystal of excellent crystallinity can be formed.

Notably, Embodiment 4 is given for the purpose of illustration only, and needless to say, those skilled in the art can conceive various modifications and variations, so long as the scope of the invention is not impaired. The number of trenches provided in the seed crystal is actually a larger number, as compared with the number of trenches illustrated in the drawings.

Embodiment 5

Embodiment 5 will be described. In Embodiment 5, the same procedure as that of Embodiment 4 is repeated, except that the growth substrate is a GaN template formed on a sapphire substrate. The below-mentioned production steps are almost the same as those of Embodiment 2. Thus, the same descriptions in relation to Embodiments 2 and 4 will be omitted.

1. Method for Producing a Group III Nitride Semiconductor Single Crystal

The method of Embodiment 5 for producing a Group III nitride semiconductor single crystal includes the following steps:

(A) Seed crystal preparation step,
(A-1) Low-temperature-deposited buffer layer formation step
(A-2) Underlayer formation step,
(A-3) Mask layer formation step,
(A-4) Trench formation step,
(B) Seed crystal etching step, and
(C) Semiconductor single crystal formation step. These steps (A) to (C) are the same as those of Embodiment 2.

1-1. (A) Seed Crystal Preparation Step 1-1-1. (A-1) Low-Temperature-Deposited Buffer Layer Formation Step Firstly, a low-temperature-deposited buffer layer 520 is formed on a sapphire substrate S50 serving as a growth substrate (see FIG. 9). The sapphire substrate S50 is formed of c-plane sapphire. The low-temperature-deposited buffer layer 520 is formed on the sapphire substrate S50 through epitaxial growth. Examples of the epitaxial growth technique include metalorganic chemical vapor deposition (MOCVD), hydride vapor phase epitaxy (HVPE), molecular beam epitaxy (MBE), and liquid phase epitaxy. Any of these techniques may be employed. The low-temperature-deposited buffer layer 520 is a GaN layer. The layer 520 may be an AlN layer.

1-1-2. (A-2) Underlayer Formation Step

Subsequently, a GaN layer 530 is formed on the low-temperature-deposited buffer layer 520 (see FIG. 9). The GaN layer 530 serves as an underlayer. The GaN layer 530 preferably has a thickness of 1 μm to 30 μm. In the underlayer formation step, any of metalorganic chemical vapor deposition (MOCVD), hydride vapor phase epitaxy (HVPE), molecular beam epitaxy (MBE), and liquid phase epitaxy may be employed.

1-1-3. (A-3) Mask Layer Formation Step

Then, a mask layer 540 is formed on the GaN layer 530 (see FIG. 9). The mask layer 540 may have the same Al compositional proportion and thickness as shown in Table 1.

1-1-4. (A-4) Trench Formation Step

Subsequently, trenches X51 are formed through photolithography, whereby a seed crystal 150 shown in FIG. 9 is produced. The trenches X51 are the same as trenches X41 of Embodiment 4 (see FIG. 4). Each trench X51 is a non-through hole which penetrates the mask layer 540 through the full thickness and the GaN substrate 530 through a partial thickness. The width of each trench X51 (opening width W57) is the same as the opening width W41 of Embodiment 4 (see FIG. 4). The depth (D54) of each trench X51 is the same as the depth D41 of Embodiment 4 (see FIG. 4). The spacing between two adjacent trenches X51 (W58) is the same as the spacing W42 of Embodiment 4 (see FIG. 4). Needless to say, however, these parameters may be different from those of Embodiment 4.

1-2. (B) Seed Crystal Etching Step

Subsequently, a semiconductor single crystal layer is formed on the seed crystal T50 through a flux method, which is a technique of liquid phase epitaxy. The same raw materials as shown in Table 2 may be used. The same conditions of the flux method as shown in Table 3 may be employed.

Figure 19:
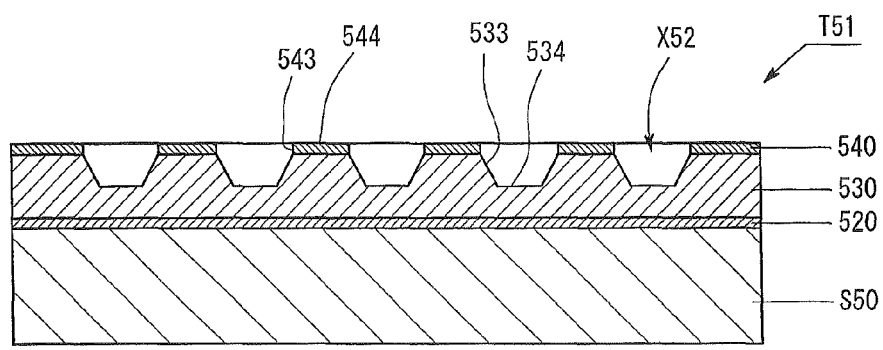
FIG. 19 is a sketch for describing a step (1) of the method for producing a Group III nitride semiconductor single crystal according to Embodiment 4.

Through melting back, exposed portions of the GaN layer 530 are preferentially dissolved. As a result, the depth of the trench X51 increases, and the width thereof slightly increases. Thus, the dimensions of each trench X51 increase as shown in FIG. 19, to thereby provide trenches X52. Each trench X52 is defined by a bottom surface 534, inclined planes 533, and side surfaces 543. The inclined planes 533 have a surface virtually equivalent to a {1,0,−1,1} plane or a {1,1,−2,2} plane.

1-3. (C) Semiconductor Single Crystal Formation Step

After the flux has been saturated through melting back and pressurization, a GaN layer 550 is grown from the surface 544, the inclined planes 533, and the bottom planes 534 of the mask layer 540, as growth starting points. The GaN layer 550 is grown from the surface 544 of the mask layer 540 in the lateral direction and the upward direction shown in FIG. 20. GaN is also formed in the trenches X52. That is, the GaN layer 550 is formed so as to cover the trenches X52.

2. Produced Group III Nitride Semiconductor Single Crystal

Figure 20:
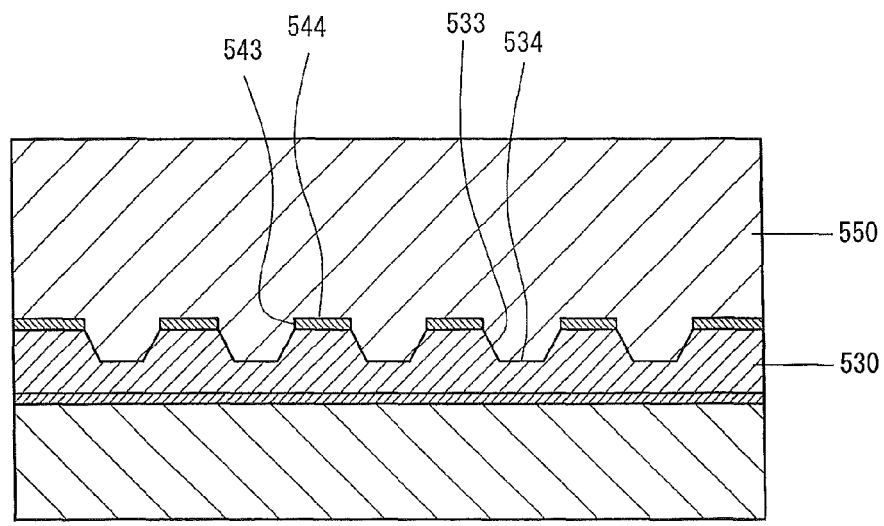
FIG. 20 is a sketch for describing a step (2) of the method for producing a Group III nitride semiconductor single crystal according to Embodiment 4.

As described above, the Group III nitride semiconductor single crystal produced in the above embodiment of the method for producing a Group III nitride semiconductor single crystal have protruded portions X53, as shown in FIG. 20. Each protruded portion X53 is defined by the bottom surface 534, inclined planes 533, and side surfaces 543.

As shown in FIG. 17, dislocations in the GaN layer 550 produced in the embodiment decrease, similar to the case of the GaN layer 450 of Embodiment 4. The GaN layer 550 has a dislocation density of $1\times10^5/cm^2$ or less.

Furthermore, the dislocation density is uniform over the GaN layer 550, since a plurality of trenches X51 are arranged in a regular manner. Thus, the GaN layer 550 produced according to the embodiment has sufficiently high crystallinity, since inheritance of dislocations from the underlayer is inhibited. As described in the Examples hereinbelow, the thickness of the produced GaN layer 550 may be adjusted to about 1 mm. As described above, portions which readily undergo melting back and portions having resistance to melting back are intentionally provided in order to merge dislocations, whereby a Group III nitride semiconductor single crystal which has excellent crystallinity and a large thickness can be produced. In addition, since dislocations can be considerably reduced at an initial growth stage, a GaN single crystal having reduced warpage can be produced.

3. Variation 3-1. Group III Nitride Semiconductor Single Crystal

In Embodiment 5, a GaN layer 550 is formed. However, the method of the invention may be applied to production of other Group III nitride semiconductor single crystals. That is, the production method of the invention is applicable to production of single-crystal $Al_xIn_yGa_{(1-X-Y)}N$ (0≤X, 0≤Y, X+Y≤1).

4. Summary of Embodiment 5

As described above, a seed crystal provided with trenches X51 is used as the seed crystal T50 for the flux method in the method for producing a Group III nitride semiconductor single crystal according to Embodiment 5. Thus, the GaN layer 530 which mainly undergoes melting back and the mask layer 540 which is resistive to melting back are formed. Therefore, dislocations extending from each trench X52 of the GaN layer 530 are merged together. As a result, dislocations are substantially untransferred to the formed GaN layer 550. Thus, a Group III nitride semiconductor single crystal of excellent crystallinity can be formed.

Notably, Embodiment 5 is given for the purpose of illustration only, and needless to say, those skilled in the art can conceive various modifications and variations, so long as the scope of the invention is not impaired. The number of trenches provided in the seed crystal is actually a larger number, as compared with the number of trenches illustrated in the drawings.

Embodiment 6

Embodiment 6 will be described. In Embodiment 6, the seed crystal is provided with trenches X31 which are arranged in a stripe pattern as shown in FIG. 13. The side surfaces 330 of each trench X31 assume the a-plane of the GaN layer. In other words, the a-plane of the GaN layer is exposed to the side surfaces of the trench X31. In this case, the GaN a-plane is formed at high growth rate, and planarization can be readily attained. In FIG. 13, the opening width is denoted by W9, and the spacing is denoted by W10.

Through the above procedure, dislocations are merged, to thereby reduce the number of dislocations present in the formed Group III nitride semiconductor single crystal. That is, a Group III nitride semiconductor single crystal of excellent crystallinity can be formed.

Embodiment 7

Embodiment 7 will be described. GaN single crystal production steps of Embodiment 7 will be described with reference to FIGS. 21 and 22.

Figure 21:
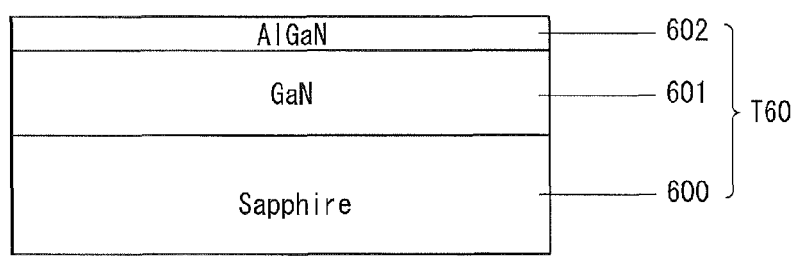
FIG. 21 is a sketch of the structure of a seed crystal employed in a method of producing a GaN crystal according to Embodiment 7.
Figure 22:
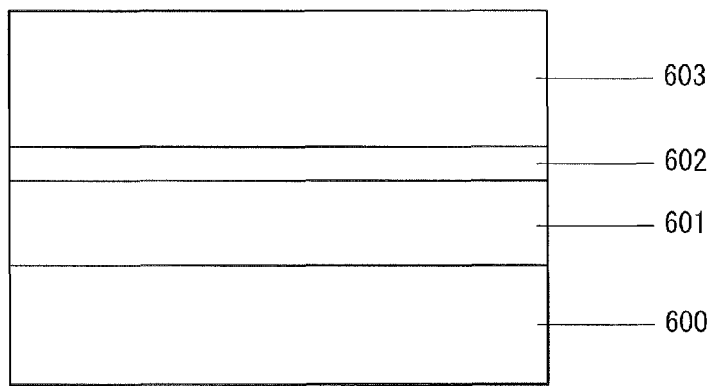
FIG. 22 is a sketch of a GaN crystal production step according to Embodiment 7.

Firstly, a seed crystal as shown in FIG. 21 is provided as a seed crystal T60. The seed crystal T60 is a template substrate and has been prepared by sequentially forming, on a c-plane sapphire substrate 600 (diameter: 2 inches), an AlN low-temperature-deposited buffer layer (not illustrated), a GaN layer 601, and an AlGaN layer 602 through MOCVD. The uppermost surface of the seed crystal T60 is the AlGaN layer 602. For enhancing the flatness and crystallinity of the AlGaN layer 602, the GaN layer 601 is formed on the sapphire substrate 600 directly or by the mediation of a buffer layer without providing an additional AlGaN layer 602.

Subsequently, the seed crystal T60 is placed in a crucible 12 on the surface thereof. Na, Ga, and C are fed to the crucible 12, and the crucible 12 is placed in a reaction vessel 11, followed by closing the vessel. Then, the reaction vessel 11 is placed in a pressure container 10, and the container 10 is closed. Na and Ga of a solid or liquid form may be placed in the crucible 12. Alternatively, a mixture of Na liquid and Ga liquid may be placed in a crucible 12. The purpose of addition of C is to prevent generation of miscellaneous crystals and to enhance nitrogen solubility of the molten mixture, to thereby promote crystal growth.

In a specific procedure, the crucible 12 was heated by means of a heating apparatus 13, to thereby form a molten mixture 21 of Na and Ga. The temperature of the molten mixture 21 was adjusted to 870° C. Through a supply pipe 14 and a discharge pipe 15, nitrogen was supplied into the reaction vessel 11, and the pressure of the reaction vessel 11 was adjusted to 3.0 MPa. Also, nitrogen was supplied to the pressure container 10 via the supply pipe 16 and the discharge pipe 17, to thereby roughly equalize with the inside pressure of the pressure container 10 to the inside pressure of the reaction vessel 11. The crucible 12 was rotated at 20 rpm, and the direction of rotation was altered at intervals of 15 seconds. The seed crystal T60 was maintained in the Ga—Na molten mixture 21. The temperature and pressure of the crucible were maintained for 60 hours, to thereby form a GaN layer 603 of the AlGaN layer 602 on the seed crystal T60 (see FIG. 22).

Subsequently, heating with pressure was stopped, to return the conditions to be ambient temperature and pressure. Thus, crystal growth of the GaN layer 603 was terminated. After termination of crystal growth, Na was removed with ethanol or the like, and the seed crystal T60 was taken from the crucible 12.

As described above, according to the embodiment of the method for producing a GaN crystal, C is added to a molten mixture. Therefore, even when a molten mixture which intrinsically causes melting back is used, melting back of the seed crystal T60 can be suppressed, as compared with the case where no C is added. Thus, a uniform GaN crystal can be produced. The reason for this is that the AlGaN layer 602 serves as the outermost surface of the seed crystal T60, and the AlGaN layer 602 is virtually undissolved during a period from start of crystal growth to supersaturation of nitrogen of the molten mixture 21, whereby the layer 602 can inhibit melting back of the seed crystal T60.

Embodiment 8

Figure 23:
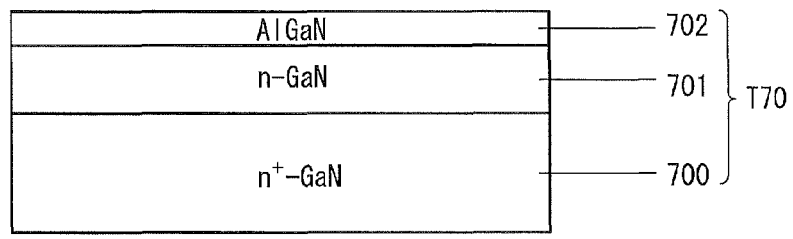
FIG. 23 is a sketch of a GaN crystal production step according to Embodiment 8.

Embodiment 8 will be described. In embodiment 8, a seed crystal T70 as shown in FIG. 23 was used. As shown in FIG. 23, the seed crystal T70 has been prepared by sequentially forming, on an $n^+$-GaN substrate 700 (diameter: 2 inches), an n-GaN layer 701 and an AlGaN layer 702 through MOCVD. The n-GaN layer 701 has a thickness of 1 μm. The AlGaN layer 702 is undoped and has a thickness of 50 nm and an Al compositional proportion of 10%.

By use of the seed crystal T70 and through the same production method and apparatus as employed in Embodiment 1, a GaN layer 703 was grown on the AlGaN layer 702.

The GaN layer 703 had a thickness of 500 μm, with variation in layer thickness of 5% or less. The GaN layer 703 was a high-quality crystal layer having no inclusion and growth abnormality.

No particular limitation is imposed on the layer structure of the seed crystal, so long as the uppermost layer is an Al-containing Group III nitride semiconductor layer (particularly, an AlGaN layer). Through employment of a seed crystal of such a layer structure, a GaN crystal having a uniform thickness can be formed, while melting back of the seed crystal can be suppressed to 500 nm or less. Examples of the layer structure include an AlGaN substrate itself, and a structure including an AlGaN layer formed directly on a sapphire substrate. Of these, a structure including an AlGaN layer stacked on a GaN layer is particularly preferred, since the flatness and crystallinity of the AlGaN layer can be enhanced. The GaN layer or the AlGaN layer may contain an n-type or a p-type impurity for controlling conductivity in accordance with needs. Such a dopant may be added for controlling magnetism. In one possible layer structure of the seed crystal T70, the AlGaN layer 702 is stacked on the $n^+$-GaN substrate 700 directly or by the mediation of a buffer layer, without employing the n-GaN layer 701. Through employment of such a layer structure, the uppermost AlGaN layer can inhibit melting back of the seed crystal.

The Al-containing Group III nitride semiconductor layer, serving as the uppermost layer of the seed crystal, preferably has a thickness of 2 nm to 2 μm. When the thickness is less than 2 nm, melting back inhibition effect is poor, whereas when the thickness is in excess of 2 μm, formation of the Al-containing Group III nitride semiconductor layer requires a long period of time, thereby impairing seed crystal productivity, and the crystal quality of the Group III nitride semiconductor crystal formed on the Al-containing Group III nitride semiconductor layer is impaired.

The Al-containing Group III nitride semiconductor layer, serving as the uppermost layer of the seed crystal, preferably has an Al compositional proportion of 2% to 50%. An Al compositional proportion in excess of 50% is not preferred, since, for example, miscellaneous crystals are generated in the molten mixture, or the crystallinity of the formed Group III nitride semiconductor crystal is impaired. When the Al compositional proportion is lower than 2%, the melting back inhibition effect of the Al-containing Group III nitride semiconductor layer cannot be attained sufficiently. In Embodiment 8, an AlGaN layer was employed as the Al-containing Group III nitride semiconductor layer. However, an AlGaInN layer may also be employed, so long as the Al compositional proportion is 2 to 50%.

The Al-containing Group III nitride semiconductor layer preferably has a surface roughness (root mean square roughness) of 2 nm or less. When the root mean square roughness is more than 2 nm, melting back proceeds from rough portions, thereby possibly causing anomalous growth of a GaN crystal.

The amount of C added to the molten mixture is preferably 0.1 mol % to 2 mol %, with respect to Na. When the C amount falls within the range, the effect attributed to addition of C can be attained fully.

When the crystal growth temperature is adjusted to 850° C. to 950° C., melting back inhibition effect can be ensured. Particularly when a Group III nitride semiconductor crystal is grown at high temperature, the present invention is effectively applied, since melting back of a Group III nitride semiconductor more readily proceeds at high temperature.

Embodiment 8 is not limited to the growth of GaN. The present invention may be applied to the growth of a 4-component semiconductor such as AlGaInN or a 3-component semiconductor such as AlGaN or InGaN. However, the invention is preferably applied to the growth of GaN, since the compositional proportions can be more readily controlled as compared with the cases of 3-component and 4-component Group III nitride semiconductors, and a semiconductor crystal of higher quality can be produced.

Embodiment 9

1. Method for Producing GaN Substrate

Embodiment 9 will be described. Embodiment 9 is directed to a GaN substrate production method including removal, from a seed crystal, of the GaN single crystal produced through the method for producing a Group III nitride semiconductor single crystal (any of Embodiments 1 to 8), to thereby provide a GaN substrate.

2. Semiconductor Single Crystal Separation Step

As described above, when a GaN single crystal the provided with non-crystal portions X13 or X23, the GaN layer 150 or 250 can be readily removed from the corresponding growth substrate, since the presence of non-crystal portions X13 or X23 reduces adhesion strength to the underlayer. As shown in FIG. 8 or 12, a GaN single crystal is separated from the growth substrate. Separation may be performed through heating/cooling on the basis of the difference in thermal expansion coefficient.

Actually, in some cases, the mask layer 140 or 240 and the non-crystal portions X13 or X23 are partially adhered to the GaN single crystal. In such a case, the bottom surface 151 or 251 is ground, to thereby solve the problem.

3. Summary of Embodiment 9

As described above, the method for producing a GaN substrate of Embodiment 9 includes removing the GaN single crystal formed in any of Embodiments 1 to 3 from the growth substrate, to thereby provide a GaN self-standing substrate. Needless to say, a seed crystal may be separated from the Group III nitride semiconductor single crystal produced in any of Embodiments 4 to 8, to thereby produce a GaN substrate. The thus-produced GaN substrate may be used as a growth substrate for producing semiconductor devices (e.g., light-emitting devices and field-effect transistors) employing a Group III nitride semiconductor.

EXAMPLE 1

Example 1 will be described. In Example 1, similar to Embodiment 2, a sapphire substrate S20 was employed. The sapphire substrate S20 had a diameter of 2 inches (50.8 mm). A seed crystal T20 was formed through MOCVD.

The carrier gas employed in the method is hydrogen ($H_2$), nitrogen ($N_2$), or a gas mixture of hydrogen and nitrogen ($H_2+N_2$). Ammonia gas ($NH_3$) was employed as a nitrogen source. Trimethylgallium ($Ga(CH_3)_3$, hereinafter may be referred to as "TMG") was employed as a Ga source. Trimethylaluminum ($Al(CH_3)_3$, hereinafter may be referred to as "TMA") was employed as an Al source.

Firstly, a GaN layer serving as the low-temperature-deposited buffer layer 220 was formed. On the low-temperature-deposited buffer layer 220, a GaN layer 230 was formed. The GaN layer had a thickness of 8 μm. Subsequently, an AlGaN layer 240 was formed on the GaN layer 230. The AlGaN layer 240 had an Al compositional proportion of 0.1 and a thickness of 100 nm.

Then, trenches X21 were formed through photolithography. The depth (D4) of each trench X21 was adjusted to 1 μm, and the width (W7) thereof was adjusted to 20 μm. The spacing (W8) of two adjacent trenches X21 was adjusted to 20 μm. Thus, a seed crystal T10 was produced.

Subsequently, the seed crystal T20 and raw materials were fed to a crucible. The raw materials were Ga (30 g), Na (30 g), and C (80 mg). The carbon proportion of the flux was adjusted to 0.5 mol %. The inside temperature and pressure of the crucible were controlled to 890° C. and 3 MPa. During crystal growth, the direction of rotation was appropriately altered, and the mixture was stirred at 20 rpm by means of a rotating member. The growth time was 30 hours.

As a result, a GaN crystal having a layer thickness of 0.9 mm was yielded. Provision of spaces X23 was confirmed under an SEM. During lowering the temperature after the growth, the sapphire substrate S20 was separated from the GaN crystal. The thus-obtained single crystal was found to have a dislocation density of $1 \times 10^4/cm^2$ or less.

EXAMPLE 2

Example 2 will be described. Almost the same experiment conditions as employed in Example 1 were employed in Example 2. However, in Example 2, a GaN substrate having a diameter of 4 inches (101.6 mm) was used. Example 2 corresponds to Embodiment 1.

In Example 2, a GaN crystal having a layer thickness of 1.5 mm was produced. Then, the inside temperature of the crucible was lowered at 1 degree/min. Through the cooling, the GaN crystal was spontaneously separated from the sapphire substrate S30.

EXAMPLE 3

Example 3 will be described. Similar to Embodiment 4, a GaN substrate G10 having a diameter of 2 inches (50.8 mm) was used as an underlayer in Example 3.

1. Mask Layer Formation Step

Firstly, an AlGaN layer was formed on the GaN substrate G40. The AlGaN layer had an Al compositional proportion of 0.1. The thickness of the AlGaN layer was adjusted to 100 nm.

2. Trench Formation Step

Then, trenches X41 were formed through photolithography. The depth (D41) of each trench X41 was adjusted to 1 μm, and the width (W41) thereof was adjusted to 50 μm. The spacing (W42) of two adjacent trenches X41 was adjusted to 30 μm. Thus, a seed crystal T40 was produced.

3. Semiconductor Single Crystal Formation Step

Subsequently, the seed crystal T40 and raw materials were fed to a crucible. The raw materials were Ga (30 g), Na (30 g), and C (80 mg). The carbon proportion of the flux was adjusted to 0.5 mol %. The inside temperature and pressure of the crucible were controlled to 870° C. and 3 MPa. During crystal growth, the direction of rotation was appropriately altered, and the mixture was stirred at 20 rpm by means of a rotating member. The growth time was 100 hours.

As a result, a GaN crystal having a layer thickness of 1.5 mm was yielded. The crystallinity of the GaN single crystal layer was substantially uniform. The thus-obtained single crystal was found to have a dislocation density of $1 \times 10^4/cm^2$ or less. No cracks or other faults were generated, and the single crystal layer had a flat surface.

EXAMPLE 4

Example 4 will be described. Similar to Embodiment 5, a sapphire substrate S50 having a diameter of 2 inches (50.8 mm) was used. A seed crystal T50 was formed through MOCVD.

2-1. Low-Temperature-Deposited Buffer Layer Formation Step

Firstly, a GaN layer was formed as a low-temperature-deposited buffer layer 520.

2-2. Underlayer Formation Step

Then, a GaN layer 530 was formed on the low-temperature-deposited buffer layer 520. The GaN layer 530 had a thickness of 10 μm.

2-3. Mask Layer Formation Step

On the GaN layer 530, an AlGaN layer 540 was formed. The AlGaN layer 540 had an Al compositional proportion of 0.2. The AlGaN layer 540 had a thickness of 50 nm.

2-4. Trench Formation Step

Then, trenches X51 were formed through photolithography. The depth (D54) of each trench X51 was adjusted to 1 μm, and the width (W57) thereof was adjusted to 100 μm. The spacing (W58) of two adjacent trenches X51 was adjusted to 30 μm. Thus, a seed crystal T50 was produced.

2-5. Semiconductor Single Crystal Formation Step

Subsequently, the seed crystal T50 and raw materials were fed to a crucible. The raw materials were Ga (30 g), Na (30 g), and C (80 mg). The carbon proportion of the flux was adjusted to 0.5 mol %. The inside temperature and pressure of the crucible were controlled to 870° C. and 3 MPa. During crystal growth, the direction of rotation was appropriately altered, and the mixture was stirred at 20 rpm by means of a rotating member. The growth time was 100 hours.

As a result, a GaN single crystal having a layer thickness of 1.5 mm was yielded. The crystallinity of the GaN single crystal layer was substantially uniform. The thus-obtained single crystal was found to have a dislocation density of $1 \times 10^5 / cm^2$ or less.

EXAMPLE 5

The GaN layer 601 was undoped and had a thickness of 2 μm. The AlGaN layer 602 was unposed and had a thickness of 100 nm and an Al compositional proportion of 5% (the ratio of Al to the sum of Al and Ga, unit: mol %, $Al_{0.05}Ga_{0.95}N$). The raw materials were Na (30 g), Ga (30 g), and C (80 mg).

The thus-grown GaN layer 603 was uniform over the layer and had a thickness of 500 μm. The layer had a variation in layer thickness of 5% or less. The GaN layer 603 was a transparent crystal layer having no inclusion and growth abnormality. The AlGaN layer 602 remained over the surface of the seed crystal T60, indicating that the amount of melting back was 100 nm or less.

Thus, even when a GaN crystal is formed through a Na flux method which readily causes melting back due to C added thereto, melting back of the seed crystal T60 can be suppressed, whereby a uniform GaN crystal can be produced. The reason for this is that the AlGaN layer 602 serves as the outermost surface of the seed crystal T60, and the AlGaN layer 602 is virtually undissolved during a period from start of crystal growth to supersaturation of nitrogen of the molten mixture 21, whereby the layer 602 can inhibit melting back of the seed crystal T60.

Since melting back of the seed crystal T60 is suppressed, the quality of the formed crystal is remarkably improved, and the thickness of the GaN layer 601 can be reduced as compared with a conventionally attained thickness. Thus, the seed crystal T60 can be produced in a shorter period of time, whereby productivity of the seed crystal T60 can be enhanced. Accordingly, productivity of a GaN crystal can be enhanced.

EXAMPLE 6

In Example 6, the following seed crystal 170 was used instead of the seed crystal of Example 5. As shown in FIG. 23, the seed crystal 170 was prepared by sequentially forming, on a c-plane $n^+$-GaN substrate 700 (diameter: 2 inches), an n-GaN layer 701 and an AlGaN layer 702 through MOCVD. The n-GaN layer 701 had a thickness of 1 μm. The AlGaN layer 702 is undoped and had a thickness of 50 nm and an Al compositional proportion of 10%.

By use of the seed crystal 170 and through the same production method and apparatus 1 as employed in Embodiment 1, a GaN layer 703 was grown on the AlGaN layer 702. The GaN layer 703 had a thickness of 500 μm, with variation in layer thickness of 5% or less. The GaN layer 703 was a high-quality crystal layer having no inclusion and growth abnormality.

Figure 24:
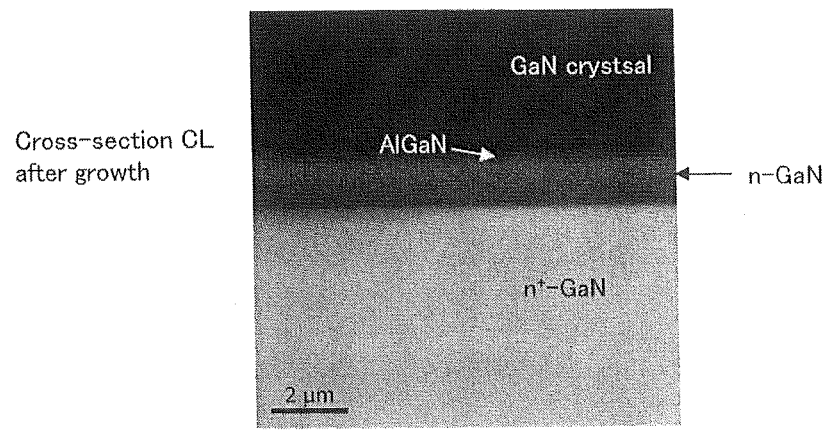
FIG. 24 is a CL image of a seed crystal of Example 6 after completion of crystal growth.

FIG. 24 is a CL (cathode luminescence) image of the seed crystal 170 after completion of the growth. As shown in FIG. 24, the interface between the AlGaN layer 702 of the seed crystal 170 and the formed GaN layer 703 is flat. Also, since the thickness of the AlGaN layer 702 was unchanged, no melting back occurred in the AlGaN layer 702. Thus, the AlGaN layer 702, which serves as the uppermost layer of the seed crystal 170, can serve as a stopper layer which inhibits further progress of melting back. By virtue of the uppermost layer, melting back of the seed crystal 170 is suppressed.

COMPARATIVE EXAMPLE 1

Figure 25:
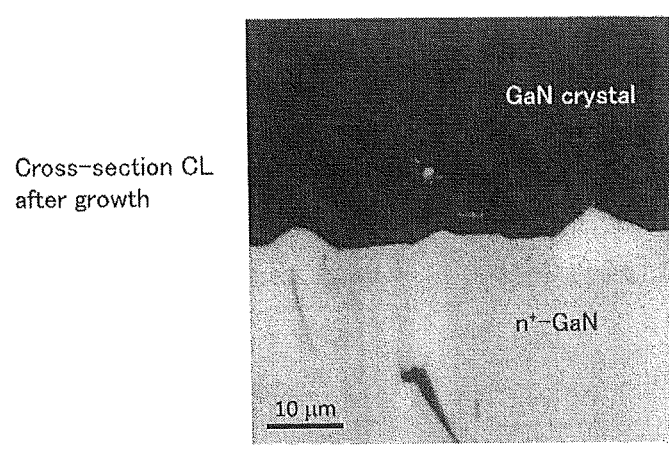
FIG. 25 is a CL image of a seed crystal of Comparative Example 1 after completion of crystal growth.

A seed crystal was produced by stacking an n-GaN layer having a thickness of 1 μm on an $n^+$-GaN substrate having a diameter of 2 inches through MOCVD. By use of the seed crystal and through the same production method and apparatus 1 as employed in Embodiment 1, a GaN crystal was produced. FIG. 25 is a CL image of the seed crystal of Comparative Example 1 after completion of the growth. As shown in FIG. 25, the n-GaN layer of the seed crystal disappeared through melting back, and the $n^+$-GaN substrate was exposed. The interface between the $n^+$-GaN substrate and the formed GaN layer was found to have irregularities. Melting back of the seed crystal reached the $n^+$-GaN substrate, and the melting back non-uniformly proceeded due to variation in temperature, solution composition, etc. of the molten mixture. Anomalous growth was observed in a portion of the formed GaN layer.

COMPARATIVE EXAMPLE 2

A template substrate was produced by stacking an AlN layer having a thickness of 1 μm on a c-plane sapphire substrate having a diameter of 2 inches through MOCVD, to thereby provide a seed crystal. By use of the seed crystal and through the same production method and apparatus 1 as employed in Embodiment 1, a GaN crystal was produced. Although GaN was formed on the entire surface of the seed crystal, the surface of the formed GaN crystal had considerable roughness, and a large number of inclusions were found in the crystal. The GaN crystal had a large lattice defect density and a large number of cracks. That is, the crystal had considerably poor quality. This is due to poor flatness of the AlN surface, resulting in a large difference in lattice constant with respect to GaN.

[Notes]

Characteristic features of the present invention are as follows.

1. A plurality of the trenches are arranged in the mask layer in a lattice-like pattern.
2. A plurality of the trenches are arranged in the mask layer in a stripe pattern.

3. The molten mixture has a carbon (C) concentration of 0.01 mol/L to 2 mol/L.
4. The molten mixture has a carbon (C) concentration of 0 mol/L to 2 mol/L.
5. In the mask layer formation step, the mask layer has an Al compositional proportion X of 0.03 to 0.50.
6. The underlayer is a GaN substrate.
7. The underlayer is a GaN layer formed on a sapphire substrate.
8. The seed crystal is a template substrate in which an AlGaN layer serving as the uppermost layer is stacked on a sapphire substrate.
9. The GaN layer is a GaN substrate.
10. The Al-containing Group III nitride semiconductor layer has an Al ratio with respect to the Group III metal of 2 to 50 mol %.
11. Before growth of the Group III nitride semiconductor crystal, the Al-containing Group III nitride semiconductor layer has a thickness of 2 nm to 2 μm.
12. Before growth of the Group III nitride semiconductor crystal, the Al-containing Group III nitride semiconductor layer has a root mean square surface roughness of 2 nm or less.
13. The molten mixture contains carbon in an amount of 0.1 to 2 mol % with respect to the alkali metal.
14. In the seed crystal etching step, a plurality of trenches having an opening width of 1 μm to 500 μm are formed.
15. In the seed crystal etching step, a plurality of trenches having an opening width of 1 μm to 1,000 μm are formed.
16. The facet plane is a $\{1,1,-2,2\}$ plane.

What is claimed is:

1. A method for producing a Group III nitride semiconductor single crystal, the method comprising:
   forming a mask layer consisting of an $Al_xIn_yGa_{(1-X-Y)}N$ ($0<X$, $0\leq Y$, $X+Y\leq 1$) single layer on an underlayer, the $Al_xIn_yGa_{(1-X-Y)}N$ single layer of the mask layer including Al;
   forming trenches by removing an area of the mask layer through a full thickness and a corresponding area of the underlayer through a partial thickness, to thereby form a seed crystal in which a portion of the underlayer is covered with the mask layer and in which a remaining portion of the underlayer is not covered with the mask layer;
   etching the seed crystal by melting back the remaining portion of the underlayer in a melt including at least an alkali metal, to thereby expose inclined planes; and
   forming a non-crystal portion comprising a molten mixture, and growing the Group III nitride semiconductor single crystal from a surface of the $Al_xIn_yGa_{(1-X-Y)}N$ single layer of the mask layer as the seed crystal, to thereby form the Group III nitride semiconductor single crystal on the surface of the mask layer and the non-crystal portion.

2. The method for producing the Group III nitride semiconductor single crystal according to claim 1, wherein, the underlayer is made of Group III nitride semiconductor, and in the etching of the seed crystal, a facet plane of the underlayer is exposed through melting back.

3. The method for producing the Group III nitride semiconductor single crystal according to claim 2, wherein, in the growing of the Group III nitride semiconductor single crystal, the Group III nitride semiconductor single crystal is grown on the seed crystal such that the facet plane is not buried with the Group III nitride semiconductor single crystal.

4. The method for producing the Group III nitride semiconductor single crystal according to claim 3, wherein, in the growing of the Group III nitride semiconductor single crystal, the non-crystal portion defined by the facet plane and the Group III nitride semiconductor single crystal is formed.

5. The method for producing the Group III nitride semiconductor single crystal according to claim 3, wherein, in the etching of the seed crystal, the c-plane of the underlayer is not exposed through the melting back.

6. The method for producing the Group III nitride semiconductor single crystal according to claim 2, wherein the facet plane is a $\{1,0,-1,1\}$ plane.

7. The method for producing the Group III nitride semiconductor single crystal according to claim 2, wherein, in the forming of the mask layer, the mask layer is formed of an AlGaN layer.

8. The method for producing the Group III nitride semiconductor single crystal according to claim 2, wherein, in the forming of the mask layer, the Al compositional proportion X in the mask layer is adjusted to 0.02 to 1.00.

9. The method for producing the Group III nitride semiconductor single crystal according to claim 2, wherein, in the forming of the mask layer, the thickness of the mask layer is adjusted to 2 nm to 2 μm.

10. The method for producing the Group III nitride semiconductor single crystal according to claim 2, further comprising:
    before the forming of the mask layer, performing an underlayer formation step of forming a GaN layer as the underlayer.

11. The method for producing the Group III nitride semiconductor single crystal according to claim 1, wherein, in the etching of the seed crystal, a side of the mask layer is etched and a thickness of the mask layer is substantially unchanged.

12. The method for producing the Group III nitride semiconductor single crystal according to claim 1, wherein in an initial stage of the etching of the seed crystal, the $Al_xIn_yGa_{(1-X-Y)}N$ single layer of the mask layer is exposed to the melt.

13. The method for producing the Group III nitride semiconductor single crystal according to claim 1, wherein, in the formation of the mask layer, the mask layer has an Al compositional proportion X of 0.03 to 0.50.

* * * * *